(12) United States Patent
Kim

(10) Patent No.: US 10,818,822 B2
(45) Date of Patent: Oct. 27, 2020

(54) LIGHT EMITTING DEVICE AND LIGHT-EMITTING MODULE HAVING SAME

(71) Applicant: LG INNOTEK CO., LTD., Seoul (KR)

(72) Inventor: Ki Hyun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 62 days.

(21) Appl. No.: 16/087,243

(22) PCT Filed: Mar. 22, 2017

(86) PCT No.: PCT/KR2017/003080
§ 371 (c)(1),
(2) Date: Sep. 21, 2018

(87) PCT Pub. No.: WO2017/164644
PCT Pub. Date: Sep. 28, 2017

(65) Prior Publication Data
US 2019/0103517 A1    Apr. 4, 2019

(30) Foreign Application Priority Data

Mar. 22, 2016  (KR) .................. 10-2016-0033927
Mar. 22, 2016  (KR) .................. 10-2016-0033931

(51) Int. Cl.
*H01L 33/36*    (2010.01)
*H01L 33/58*    (2010.01)
(Continued)

(52) U.S. Cl.
CPC ............ *H01L 33/36* (2013.01); *H01L 33/486* (2013.01); *H01L 33/54* (2013.01); *H01L 33/58* (2013.01);
(Continued)

(58) Field of Classification Search
CPC combination set(s) only.
See application file for complete search history.

(56) References Cited

U.S. PATENT DOCUMENTS

2009/0309116 A1* 12/2009 Kato .................. C09K 11/7721
                                                              257/98
2012/0153327 A1   6/2012 Kim et al.
(Continued)

FOREIGN PATENT DOCUMENTS

JP    2013-153035    8/2013
KR   10-2007-0036376   4/2007
(Continued)

OTHER PUBLICATIONS

International Search Report (with English Translation) and Written Opinion dated Jul. 10, 2017 issued in Application No. PCT/KR2017/003080.

*Primary Examiner* — Michelle Mandala
*Assistant Examiner* — Jordan M Klein
(74) *Attorney, Agent, or Firm* — KED & Associates LLP

(57) ABSTRACT

A light emitting device disclosed in the embodiment includes: a body including a recess having an open upper portion; a plurality of electrodes disposed at a bottom of the recess; and a light emitting diode disposed on at least one of the plurality of electrodes, wherein a side surface of the recess is inclined at a first angle with respect to an optical axis of the light emitting diode, and a value obtained by multiplying a value of a minimum distance between the light emitting diode and the side surface of the recess by a tangent value for the first angle ranges from 0.21 to 0.42.

14 Claims, 13 Drawing Sheets

(51) Int. Cl.
  *H01L 33/48* (2010.01)
  *H01L 33/54* (2010.01)
  *H01L 33/60* (2010.01)
  *H01L 33/22* (2010.01)
  *H01L 33/62* (2010.01)
(52) U.S. Cl.
  CPC .............. *H01L 33/22* (2013.01); *H01L 33/60* (2013.01); *H01L 33/62* (2013.01)

(56)                References Cited

U.S. PATENT DOCUMENTS

| | | | |
|---|---|---|---|
| 2012/0286319 A1* | 11/2012 | Lee | H01L 33/642 257/99 |
| 2013/0100646 A1* | 4/2013 | Yun | G02F 1/133605 362/97.1 |
| 2014/0124812 A1* | 5/2014 | Kuramoto | H01L 33/52 257/98 |
| 2017/0250327 A1* | 8/2017 | Hsieh | H01L 33/60 |

FOREIGN PATENT DOCUMENTS

| | | |
|---|---|---|
| KR | 10-2008-0030009 | 4/2008 |
| KR | 10-2012-0047666 | 5/2012 |
| KR | 10-2012-0070213 | 6/2012 |
| KR | 10-2012-0122735 | 11/2012 |
| KR | 10-2012-0127184 | 11/2012 |
| KR | 10-1430178 | 8/2014 |
| KR | 10-1469237 | 12/2014 |
| KR | 101469237 B1 * | 12/2014 |
| KR | 10-2015-0037216 | 4/2015 |

* cited by examiner

LIGHT EMITTING DEVICE AND LIGHT-EMITTING MODULE HAVING SAME

CROSS-REFERENCE TO RELATED PATENT APPLICATIONS

This application is a U.S. National Stage Application under 35 U.S.C. § 371 of PCT Application No. PCT/KR2017/003080, filed Mar. 22, 2017, which claims priority to Korean Patent Application Nos. 10-2016-0033927 and 10-2016-0033931 both filed Mar. 22, 2016, whose entire disclosures are hereby incorporated by reference.

TECHNICAL FIELD

The invention relates to a light emitting device and a light emitting module including the same.

BACKGROUND ART

A light emitting diode (LED) may constitute a light emitting source using a compound semiconductor material such as GaAs-based, AlGaAs-based, GaN-based, InGaN-based, and InGaAlP-based semiconductor materials.

Such a LED is packaged and used as a light emitting device which emits light of various colors. The light emitting device is used as a light source in various fields, such as a lighting indicator for displaying a color, a character indicator, and an image indicator.

Particularly, in case of an ultraviolet LED (UV LED), a short wavelength may be used for sterilization and purification, and a long wavelength may be used for an exposure apparatus or a curing apparatus. Since a luminous intensity of a light emitting device having such a UV LED is low, it is required to improve the luminous intensity.

DISCLOSURE

Technical Problem

An embodiment provides a light emitting device having a light emitting diode emitting a light of an ultraviolet wavelength.

An embodiment provides a light emitting device in which a distance between a light emitting diode and a side surface of a recess and an inclined angle of the side surface of the recess are optimized in the recess and a central luminous intensity is improved.

An embodiment provides an ultraviolet light emitting device and a light emitting module including the same, of which reliability is improved.

Technical Solution

A light emitting device according to an embodiment comprises: a body including a recess having an open upper portion; a plurality of electrodes disposed in the recess; and a light emitting diode disposed in the recess and electrically connected to the plurality of electrodes, wherein the recess has a inclined side surface and a bottom, the light emitting diode is disposed on a central portion of the bottom of the recess, the side surface of the recess is inclined at a first angle with respect to an optical axis of the light emitting diode, and a value obtained by multiplying a value of a minimum distance between the light emitting diode and a lower end of the side surface of the recess by a tangent value for the first angle ranges from 0.21 to 0.42.

A light emitting device according to an embodiment comprises: a body including a recess having an open upper portion; a plurality of electrodes disposed at a bottom of the recess; and a light emitting diode disposed on at least one of the plurality of electrodes, wherein the recess has the bottom and a plurality of side surfaces on a periphery, the side surfaces of the recess are inclined with respect to the bottom of the recess, each of the side surfaces of the recess includes a first region having a specular reflective surface at an upper periphery thereof and a second region having a scattered reflective surface adjacent to the bottom of the recess at a lower periphery thereof, the first region is disposed at a position equal to or higher than a height of an upper surface of the light emitting diode, the second region is disposed to face side surfaces of the light emitting diode, and the light emitting diode emits light having an ultraviolet wavelength.

According to the embodiment, wherein a minimum distance between the light emitting diode and the side surface of the recess ranges from 0.3 mm to 1 mm; and the first angle ranges from 20 degrees to 40 degrees.

According to the embodiment, wherein a central luminous intensity of light emitted from the light emitting diode is higher than a luminous intensity of ±15 degrees or ±30 degrees; and a ratio of the central luminous intensity of the light which is emitted from the light emitting diode through an optical film to a luminous intensity of ±15 degrees or ±30 degrees is 1 or more.

According to the embodiment, comprising an optical film disposed on the recess; and a stepped structure in which a periphery of the optical film is disposed on an upper periphery of the body, wherein the light emitting diode emits a wavelength of 280 nm or less.

According to the embodiment, wherein a height of the first region is higher than a height of the second region; an area of the first region is greater than an area of the second region; a height of a lower end point of the first region is higher than or equal to a height of the upper surface of the light emitting diode; a Ag metal is disposed on the first region; and a ceramic material of the body is exposed in the second region.

According to the embodiment, wherein an absolute value of a difference between a first exit angle of light which is reflected by the lower end point of the first region among rays of light emitted from the light emitting diode and a second exit angle of light which is reflected by an upper end point of the first region ranges from 17 degrees to 24 degrees.

According to the embodiment, wherein any one of the first exit angle and the second exit angle is 20 degrees or more; and the first and second regions of the side surfaces of the recess have inclined angles in a range from 45 degrees to 68 degrees with respect to an axis perpendicular.

According to the embodiment, wherein a ratio of a depth of the recess to the height of the first region ranges from 1:0.7 to 1:0.8; and a ratio of the height of the first region to the height of the second region at the side surface of the recess ranges from 2.5:1 to 3.5:1.

Advantageous Effects

According to the embodiments, a central luminous intensity of an ultraviolet light emitting device can be improved.

According to the embodiments, the central luminous intensity of the ultraviolet light emitting device can be made higher than an ambient luminous intensity.

According to the embodiments, the central luminous intensity of the ultraviolet light emitting device can be improved and thus the ultraviolet light emitting device can be applied to various applications.

According to the embodiments, reliability of the ultraviolet light emitting device and a light emitting module including the same can be improved.

MODES OF THE INVENTION

Figure 1:
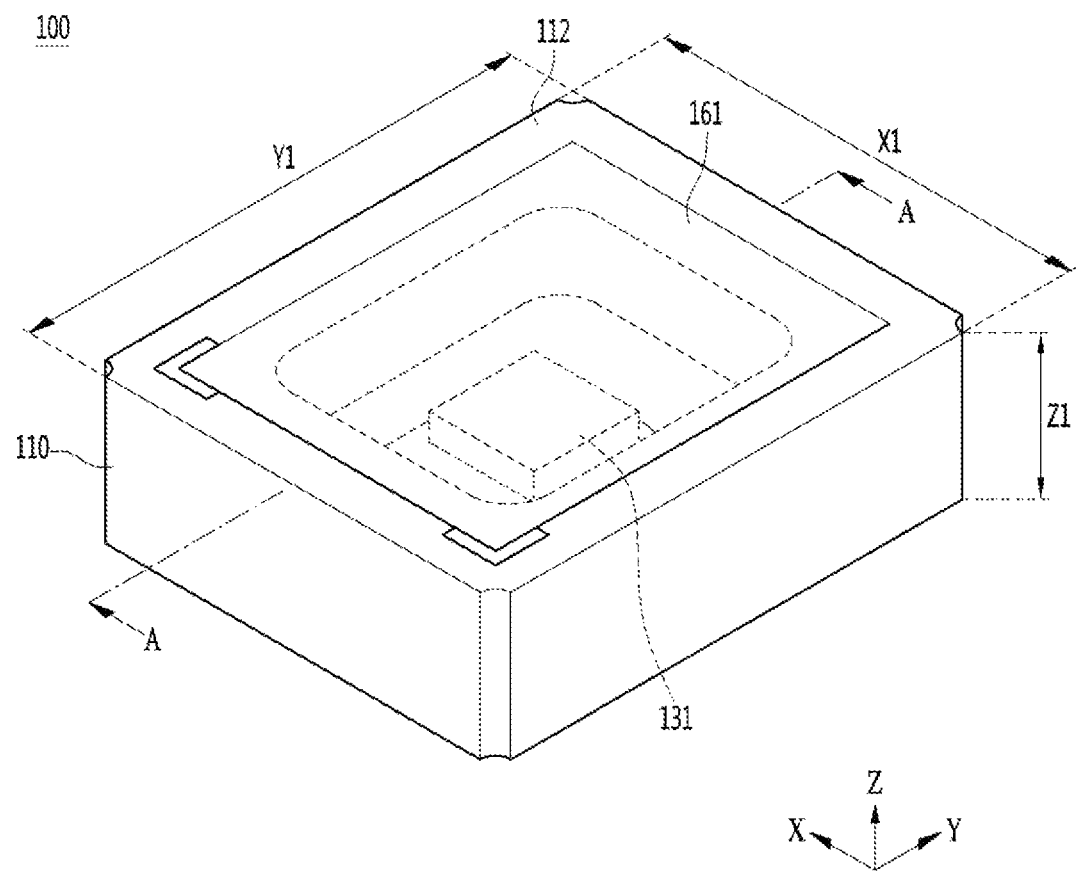
FIG. 1 is a perspective view of a light emitting device according to a first embodiment.

Hereinafter, exemplary embodiments of the present invention that are easily performed by those skilled in the art will be described in detail with reference to the accompanying drawings. However, the present invention may be implemented in various different forms and is not limited to the embodiments described herein.

In the following description, when there is an expression that some portion "includes" some structural elements, this means that some portion does not exclude another structural element, but may further include another structural element unless stated to the contrary. Further, structures and elements which do not relate to the detailed description are not shown in the drawings to clearly describe the present invention, thicknesses may be exaggerated to clearly explain various layers and regions, and similar elements in the following description are designated by similar reference numerals.

In the description of the embodiment, when a portion of a layer, a film, a region, a plate or the like is referred to as being "on" another portion, it can be "directly formed on" another portion, or a third portion can be interposed between the portions. Otherwise, when a portion is "directly formed on" another portion, it means that there is no third portion between the portions.

First Embodiment

Figure 2:
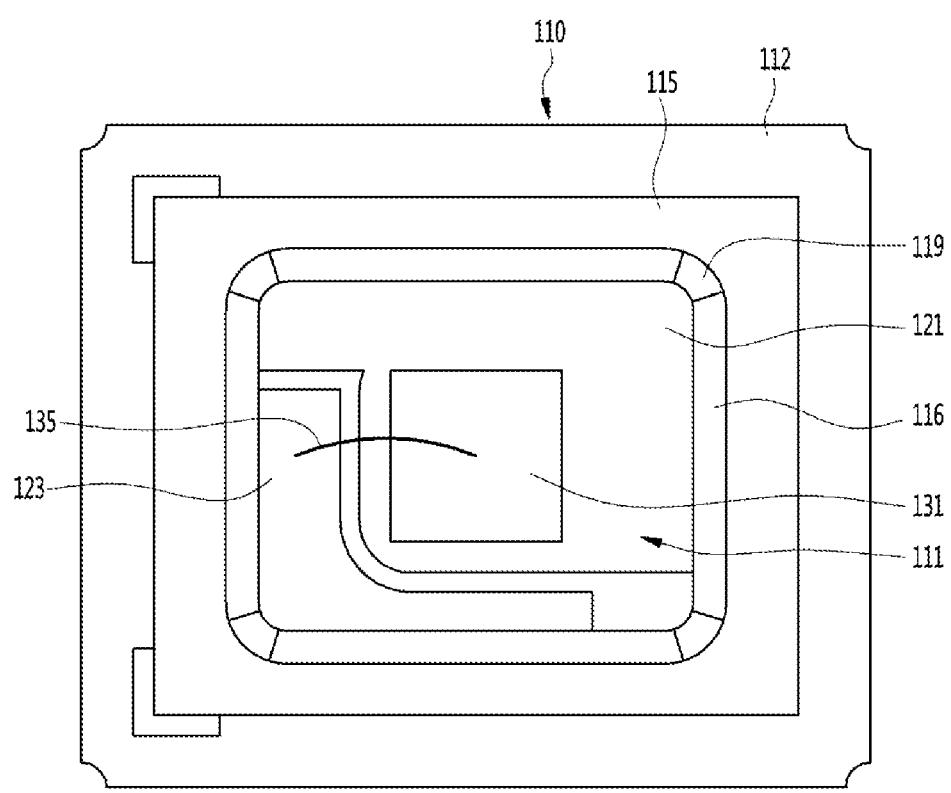
FIG. 2 is a plan view showing the light emitting device of FIG. 1 from which an optical film is removed.
Figure 3:
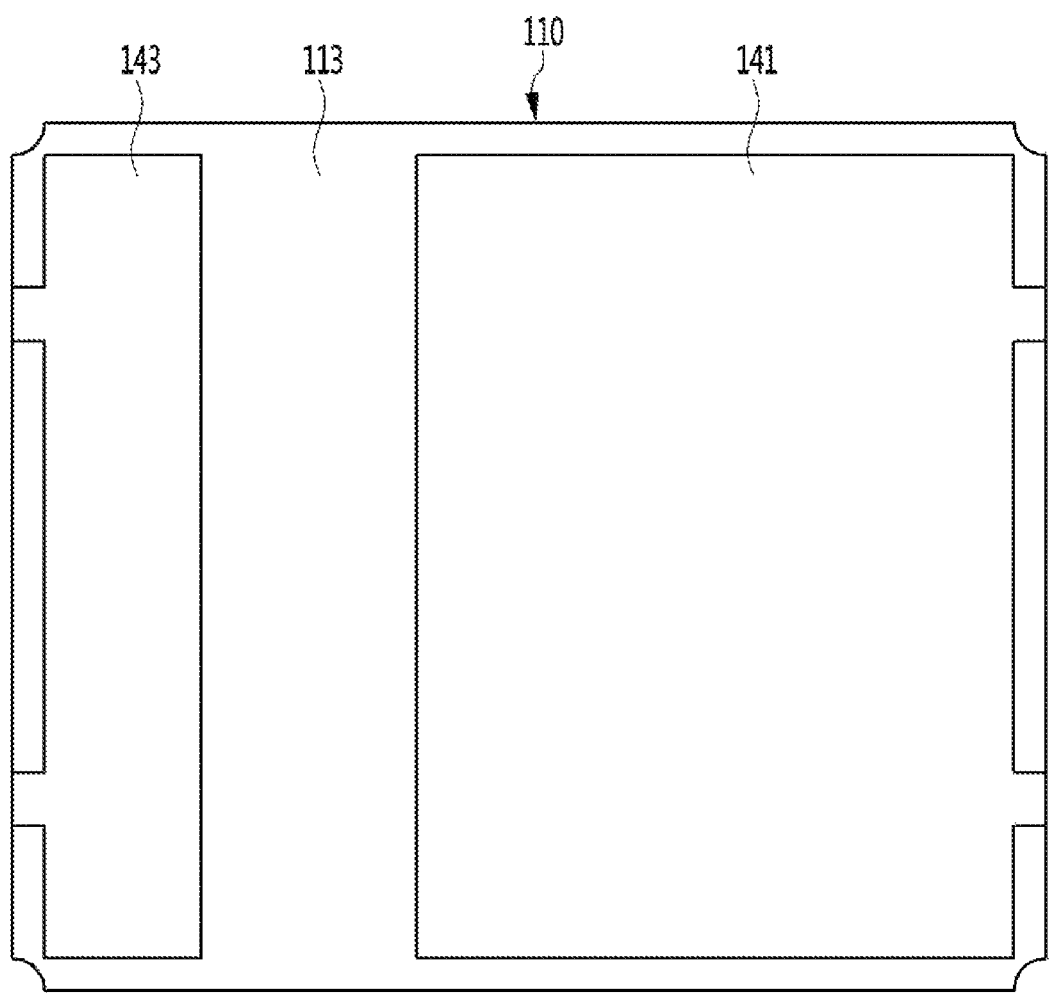
FIG. 3 is a rear view of the light emitting device of FIG. 1.
Figure 4:
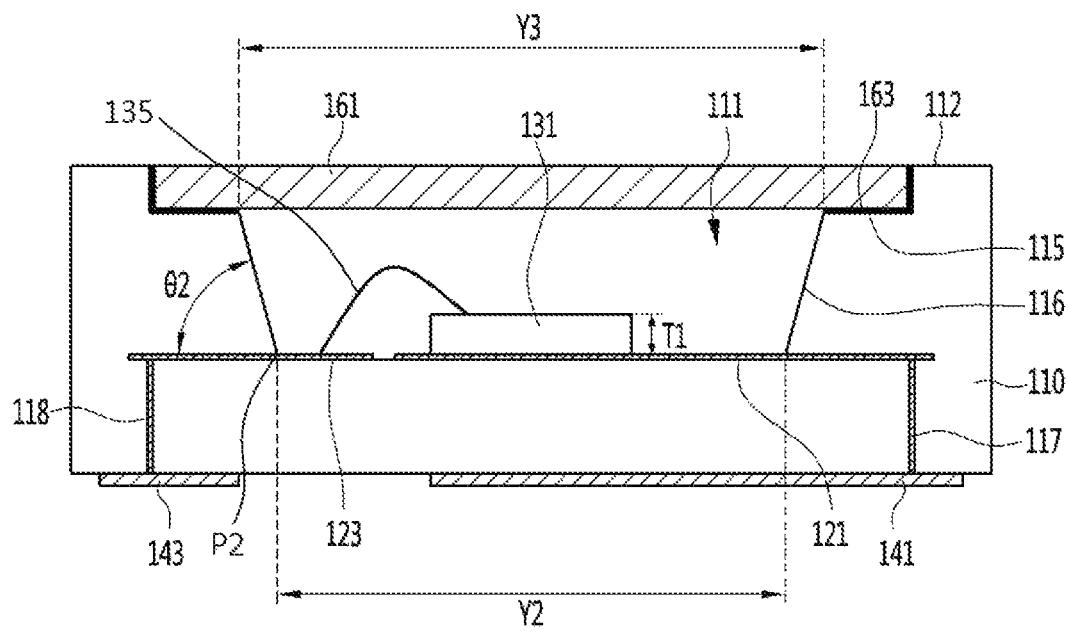
FIG. 4 is a side cross-sectional view of the light emitting device taken along line A-A of FIG. 1.
Figure 5:
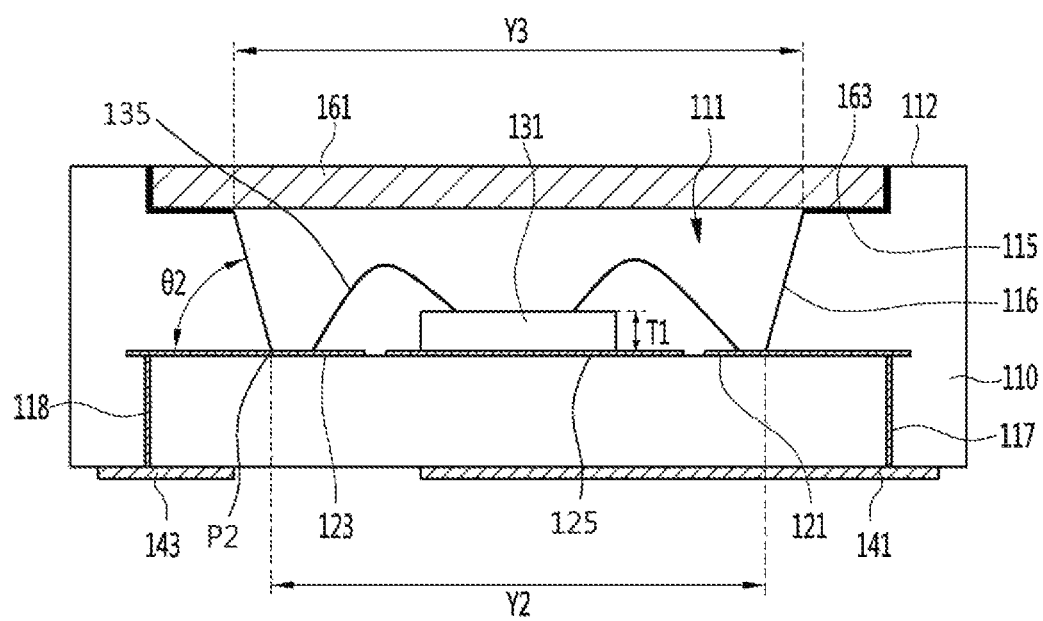
FIG. 5 is a side cross-sectional view showing another example of the light emitting device according to an embodiment.
Figure 6:
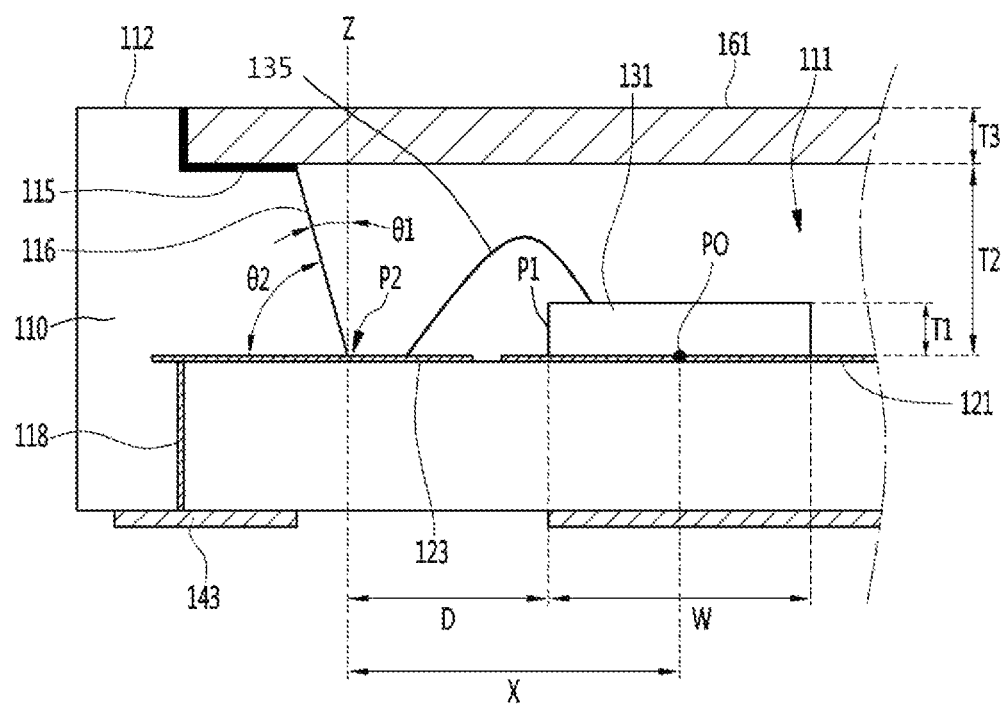
FIG. 6 is a partially enlarged view of FIG. 4, which is a view for describing a distance between a side surface of a recess and a light emitting diode.
Figure 7:
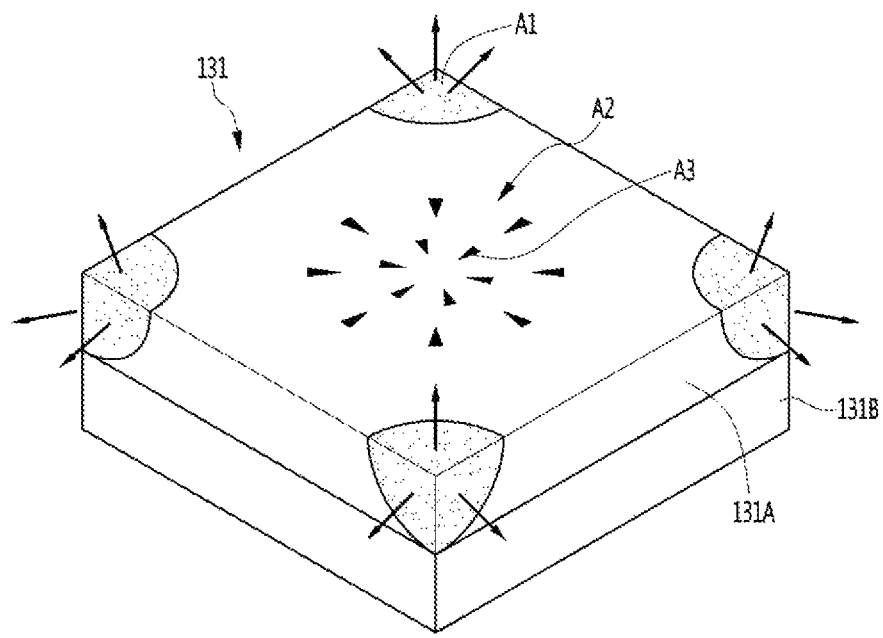
FIG. 7 is a view for describing an example of optical characteristics of the light emitting diode according to the first embodiment.

FIG. 1 is a perspective view of a light emitting device according to a first embodiment, FIG. 2 is a plan view showing the light emitting device of FIG. 1 from which an optical film is removed, FIG. 3 is a rear view of the light emitting device of FIG. 1, FIG. 4 is a side cross-sectional view of the light emitting device taken along line A-A of FIG. 1, FIG. 5 is a side cross-sectional view showing another example of the light emitting device according to an embodiment, FIG. 6 is a partially enlarged view of FIG. 4, which is a view for describing a distance between a side surface of a recess and a light emitting diode, and FIG. 7 is a view for describing an example of optical characteristics of the light emitting diode according to an embodiment.

Referring to FIGS. 1 to 7, a light emitting device 100 includes a body 110 having a recess 111, a plurality of electrodes 121 and 123 disposed in the recess 111, a light emitting diode 131 disposed on at least one of the plurality of electrodes 121 and 123, and an optical film 161 disposed on the recess 111.

The light emitting diode 131 may include a peak wavelength which is optional in a wavelength range from ultraviolet rays to visible light. The light emitting diode 131 may emit an ultraviolet wavelength, for example, a wavelength in a range from 100 nm to 400 nm.

The body 110 includes an insulating material such as a ceramic material. The ceramic material includes a low temperature co-fired ceramic (LTCC) or a high temperature co-fired ceramic (HTCC). The body 110 may be formed of a material such as AlN and may be formed of a metal nitride having a thermal conductivity of 140 W/mK or higher. Lengths X1 and Y1 of the body 110 in a first axis X direction and a second axis Y direction may be the same as or different from each other, and may be, for example, 5 mm or more. A thickness Z1 of the body 110 may be 1 mm or more, for example, may range from 1 mm to 2 mm.

The recess 111 may be a region formed by opening a portion of an upper region the body 110 and may be formed at a predetermined depth from an upper surface 112 of the body 110. The recess 111 may have a polygonal, a circular, or an elliptical top view shape. The recess 111 may be formed to have a shape in which corners 119 are chamfered, for example, a curved shape. The recess 111 may include a plurality of side surfaces 116 and the plurality of side surfaces 116 may be disposed to be inclined with respect to an axis perpendicular to a bottom of the recess 111. The material of the body 110 may be exposed at the side surface 116 of the recess 111, or a reflective layer of a metal material may be disposed on the side surface 116 of the recess 111. A reflective layer may be disposed on an upper portion of the side surface 116 of the recess 111 and the body 110 of a ceramic material may be exposed at a lower portion of the side surface 116 of the recess 111.

An upper periphery of the body 110 includes a stepped structure 115. The bottom of the recess 111 may be formed at a deeper depth than the stepped structure 115 of the body 110. A depth of the recess 111 may be greater than a sum of a thickness of the optical film 161 and a thickness of the light emitting diode 131. Here, a direction in which the recess 111 is open may be a direction in which light emitted from the light emitting diode 131 is emitted. The stepped structure 115 may be a region which is positioned at a lower level than the upper surface 112 of the body 110 and may be disposed at an upper periphery of the recess 111. A depth of the stepped structure 115 may be a depth from the upper surface 112 of the body 110 and may be greater than a thickness T3 (see FIG. 6) of the optical film 161, but the present invention is not limited thereto. Here, the recess 111 may be positioned further inside than the stepped structure 115 of the body 110.

The electrodes 121 and 123 are disposed in the recess 111 and selectively supply power to the light emitting diode 131. The electrodes 121 and 123 may optionally include a metal, such as platinum (Pt), titanium (Ti), copper (Cu), nickel (Ni), gold (Au), tantalum (Ta), or aluminum (Al), and may be formed in a single layer or multiple layers. Here, in the electrode formed in multiple layers, a material such as gold (Au) for bonding may be disposed on an uppermost layer, a material having good adhesion to the body 110, such as titanium (Ti), chromium (Cr), or tantalum (Ta), may be disposed on a lowermost layer, and a material, such as platinum (Pt), nickel (Ni), copper (Cu), or the like, may be disposed on an intermediate layer between the uppermost layer and the lowermost layer. However, the present invention is not limited to such a stacked structure of the electrodes.

Referring to FIGS. 2 and 4, the electrodes 121 and 123 include a first electrode 121 on which the light emitting diode 131 is disposed, and a second electrode 123 spaced apart from the first electrode 121. The first electrode 121 and the second electrode 123 may be spaced apart from each other at the bottom of the recess 111 and may be connected to the light emitting diode 131 via a connecting member 135 such as a wire. Since an area of the first electrode 121 at the bottom of the recess 111 is greater than an area of the second electrode 123 and an area of a portion which is heat-dissipated by the first electrode 121 is large, heat dissipation efficiency of the light emitting diode 131 can be improved. The light emitting diode 131 may be implemented as a vertical chip. As another example, the light emitting diode 131 may be disposed as a horizontal chip, and may be connected to the first and second electrodes 121 and 123 via a connecting member such as a wire or may be disposed in a flip chip manner.

The light emitting diode 131 may be disposed on a central portion of the bottom of the recess 111. Each of side surfaces of the light emitting diode 131 may be disposed at equal intervals from two or all of the side surfaces 116 of the recess 111.

As another example, as shown in FIG. 5, in addition to the first and second electrodes 121 and 123, a non-polarized heat dissipation plate 125 may be disposed at the bottom of the recess 111. The light emitting diode 131 may be disposed on the non-polarized heat dissipation plate 125 and connected to the first and second electrodes 121 and 123 via the connecting member 135 such as a wire. The heat dissipation plate 125 may be disposed inside the body 110 and may be adjacent to or be exposed at the bottom of the body 110.

A plurality of pads 141 and 143 are disposed on a lower surface 113 of the body 110 as shown in FIGS. 3 and 4. For example, the plurality of pads 141 and 143 may include a first pad 141 and a second pad 143. The first and second pads 141 and 143 may be disposed on the lower surface 113 of the body 110 to be spaced apart from each other. At least one of the first and second pads 141 and 143 may be disposed to have a plurality of pads and may disperse a current path, but the present invention is not limited thereto. An area of the first pad 141 disposed on the lower surface 113 of the body 110 may be greater than an area of the second pad 143, so that heat dissipation efficiency can be improved. The first pad 141 may be disposed to overlap the light emitting diode 131 in a vertical direction. As another example, in addition to the first and second pads 141 and 143, a non-polarized heat dissipation pad may be disposed between the first and second pads 141 and 143 on the lower surface 113 of the body 110.

A plurality of via electrodes 117 and 118 may be disposed in the body 110. The plurality of via electrodes 117 and 118 may provide electrical connection paths between the recess 111 and the lower surface of the body 110. The via electrodes 117 and 118 may include a first via electrode 117 and a second via electrode 118. The first via electrode 117 may connect the first electrode 121 to the first pad 141 and the second via electrode 118 may connect the second electrode 123 to the second pad 143.

In the light emitting device 100 according to the embodiment, a protective element (not shown) may be further disposed in the recess 111 of the body 110. The protective element may electrically protect the light emitting diode 131. The protective element may include a Zener diode.

In the light emitting device 100 according to the embodiment, a heat dissipating member (not shown) may be disposed in the body 110. The heat dissipating member may be disposed under the light emitting diode 131, that is, under the first electrode 121, and may transfer heat, which is generated from the light emitting diode 131, to the heat dissipation pad or the first pad which is disposed thereunder. A material of the heat dissipating member may be a metal, for example, an alloy.

The light emitting diode 131 may be an ultraviolet light emitting diode, and may be an ultraviolet light emitting diode having a wavelength in a range from 100 nm to 280 nm. That is, the light emitting diode 131 may emit ultraviolet rays having a short wavelength of 280 nm or less. The wavelength of the ultraviolet rays has an effect of reducing various biological contaminants such as germs, bacteria, viruses, and the like. The light emitting diode 131 may be bonded to the first electrode 121 using a conductive adhesive and may be electrically connected to the second electrode 123 using the first connecting member 135. The light emitting diode 131 may be electrically connected to the first electrode 121 and the second electrode 123. The light emitting diode 131 may be formed of a compound semiconductor of an element of Group II and Group VI or a compound semiconductor of an element of Group III and Group V. For example, the light emitting diode 131 may selectively include a semiconductor light emitting device manufactured by using a compound semiconductor, such as AlInGaN, InGaN, AlGaN, GaN, GaAs, InGaP, AlInGaP, InP, or InGaAs series. The light emitting diode 131 may include an N-type semiconductor layer, a P-type semiconductor layer, and an active layer. The active layer may be implemented with compound semiconductors in pairs, such as InGaN/GaN, InGaN/AlGaN, InGaN/InGaN, GaN/AlGaN, InAlGaN/InAlGaN, AlGaAs/GaAs, InGaAs/GaAs, InGaP/GaP, AlInGaP/InGaP, and InP/GaAs. A thickness T1 of the light emitting diode 131 may range from 0.3 mm to 1 mm and a width W may be in a range of 2 mm±1 mm, but the present invention is not limited thereto.

As shown in FIGS. 1 and 4, the optical film 161 is disposed on the recess 111 of the body 110. The optical film 161 includes a glass material such as quartz glass. Accordingly, the optical film 161 may be defined as a material which can transmit light without damage such as bond breakage between molecules due to the light emitted from the light emitting diode 131, for example, light having an ultraviolet wavelength.

An outer periphery of the optical film 161 is disposed on the stepped structure 115 of the body 110. An adhesive material 163 is disposed between the optical film 161 and the stepped structure 115 of the body 110. The adhesive material 163 includes a resin material such as silicone or epoxy. The optical film 161 may have a width wider than a width Y2 (see FIG. 4) of the bottom of the recess 111. An area of a lower surface of the optical film 161 may be greater than an area of the bottom of the recess 111. Accordingly, the optical film 161 may be easily mounted on the stepped structure 115 of the body 110. The stepped structure 115 of the body 110 may be removed. In this case, the optical film 161 may be attached to the upper surface of the body 110. The thickness T3 of the optical film 161 may be 0.1 mm or more, for example, may range from 0.1 mm to 0.5 mm. When the thickness T3 of the optical film 161 is out of the above range, light extraction efficiency may be lowered.

The optical film 161 may be spaced apart from the light emitting diode 131. The optical film 161 may be prevented from being inflated by the heat generated by the light emitting diode 131 because the optical film 161 is spaced apart from an upper surface of the light emitting diode 131. A space under the optical film 161 may be an empty space, or may be filled with a non-metallic or metallic chemical element, but the present invention is not limited thereto. A lens may be coupled onto the optical film 161, but the present invention is not limited thereto. A reflective member made of a resin material may be further disposed on the side surface of the body 110 to perform moisture proofing and element protection.

Here, referring to FIG. 7, the light emitting diode 131 has a characteristic in which most of light is emitted in corner regions A1 and an edge region and light of 30% or less is emitted from a central region A2 excluding the corner regions A1 or the edge region, when viewed from an upper surface of a chip. Since most of defects A3 which are present on an upper surface of a chip in a manufacturing process of the light emitting diode 131 are focused on the central region A2, the light emitting diode 131 has a characteristic in which most of light is emitted to the corner regions A1 or the edge region.

Figure 17:
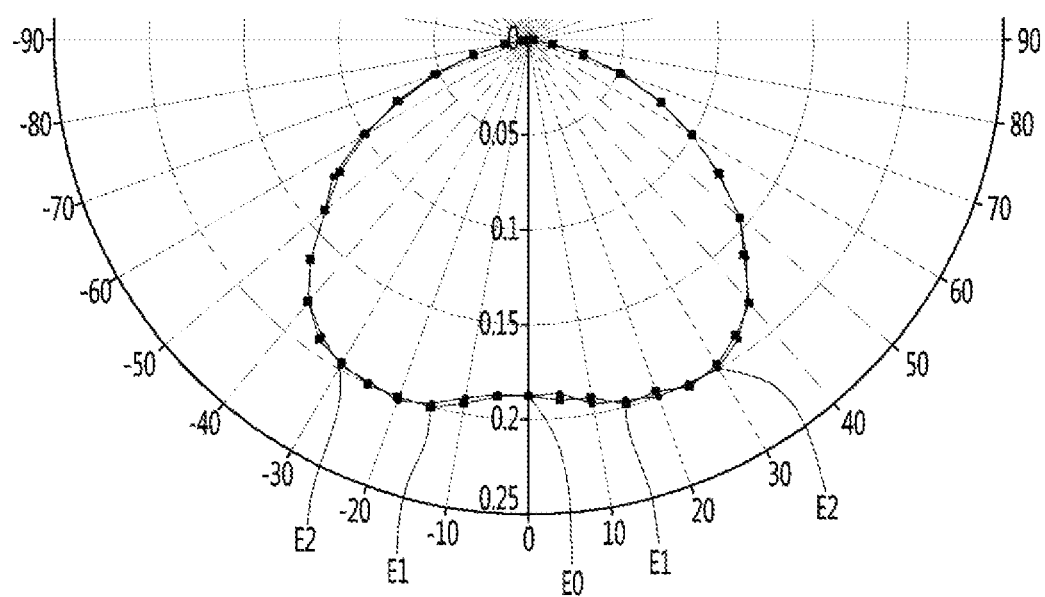
FIG. 17 is a view showing a luminous intensity of a light emitting device according to a comparative example.

In the light emitting device having the light emitting diode 131, luminous efficiency may be lowered to 60% or less, and as a comparative example, the light emitting device has a Lambertian distribution in which a central luminous intensity is lower than an ambient luminous intensity, as shown in FIG. 17. In the light emitting device having the Lambertian distribution, there is a problem in that, applications that can be applied is reduced due to the low central luminous intensity. According to the embodiment, a structure of the recess 111 of the light emitting device 100 may be changed so that efficiency of the light emitted from the light emitting device 100 may become 67% or more, and thus the light emitting device 100 may be applied to various applications. The light emitting device 100 according to the embodiment may provide a recessed structure in which a central luminous intensity of the emitted light is higher than an ambient luminous intensity.

In the recessed structure of the body 110 of the light emitting device 100 according to the embodiment, a width Y3 of an upper portion of the recess 111 may be wider than a width Y2 of a lower portion of the recess 111. The width of the recess 111 may gradually increase from the bottom of the recess toward the optical film 161 or the stepped structure 115. The side surface 116 of the recess 111 may be inclined at a predetermined angle θ2 with respect to a horizontal extension line of the bottom of the recess 111. The inclined angle θ2 may range from 50 degrees to 70 degrees, for example, from 55 degrees to 68 degrees. There is a problem in that light extraction efficiency is lowered when the angle θ2 of the side surface 116 is greater or smaller than the above range. The side surface 116 of the recess 111 may be a surface of a ceramic material, or a reflective layer of a metal material may be further disposed thereon. For example, the reflective layer may be formed of a specular reflection material. The side surface 116 of the recess 111 may be defined as a reflective surface.

A shortest distance D from the side surface 116 of the recess 111, for example, a lower end of the side surface 116, to the side surface of the light emitting diode 131 may be 1 mm or less, for example, may range from 0.3 mm to 1 mm. There is a problem in that, when the distance D is greater than 1 mm, a central luminous intensity of the light emitting device 100 may be lower than an ambient luminous intensity, and when the distance D is smaller than 0.3 mm, luminous efficiency of the light emitting device 100 is lowered. According to the embodiment, the inclined angle θ2 of the side surface 116 of the recess 111 and the distance D may be optimized and thus the central luminous intensity and the luminous efficiency can be improved. In the light emitting device 100 according to the embodiment, the central luminous intensity (0 degrees) may be greater than the ambient luminous intensity, for example, a luminous intensity at ±15 degrees and a luminous intensity at ±30 degrees. Further, the luminous efficiency of the light emitting device 100 may be 67% or higher, for example, 70% or higher.

Figure 15:
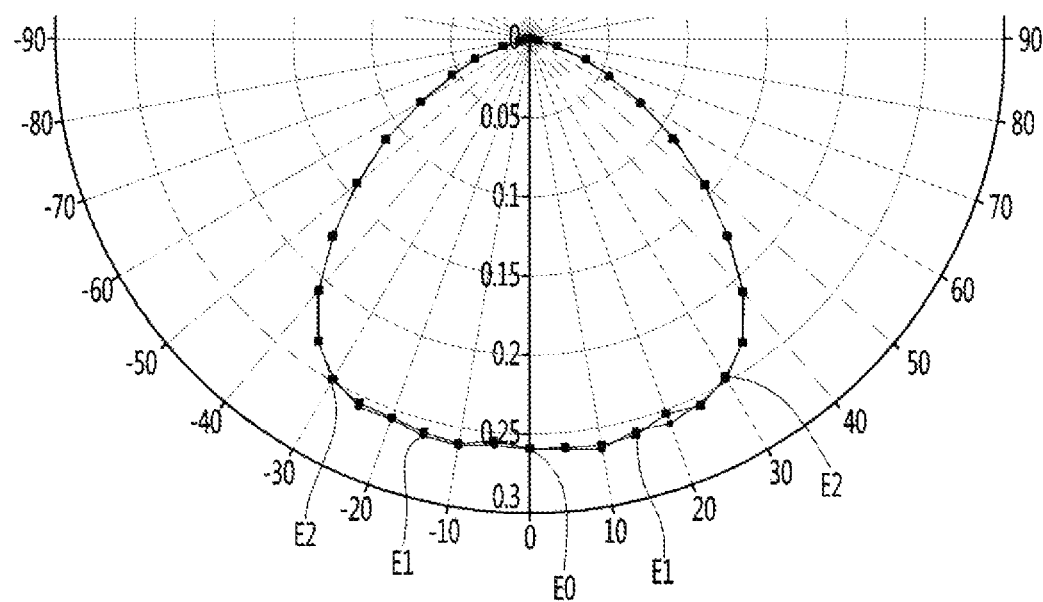
FIG. 15 is a view showing a second example of the luminous intensity of the light emitting device according to the embodiment.
Figure 16:
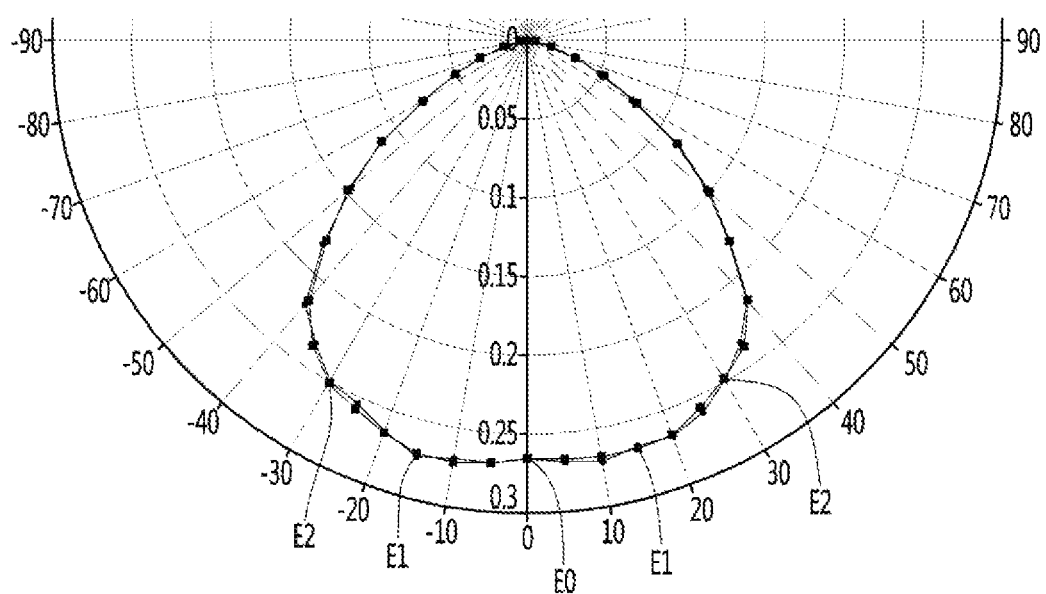
FIG. 16 is a view showing a third example of the luminous intensity of the light emitting device according to the embodiment.

Referring to FIGS. 4 and 6, it is desired to seek a condition that a central luminous intensity E0 is improved as shown in FIGS. 15 to 17 under a condition that a total light output of the light emitting device is not reduced by using an interval between the light emitting diode 131 and a lower end P2 of the side surface 116 of the recess 111, for example, a straight-line distance D or a shortest distance, and a first angle θ1 inclined with respect to an optical axis Z of the side surface 116 of the recess 111. The first angle θ1 may be in a range obtained by subtracting an angle θ2 from 90 degrees, and may range from 20 degrees to 40 degrees, for example, from 22 degrees to 35 degrees. There is a problem in that light extraction efficiency is lowered when the first angle θ1 of the side surface 116 is greater or smaller than the above range. As shown in FIGS. 15 to 17, the central luminous intensity E0 (0 degrees) of the light emitted from the light emitting device 100 may be greater than a luminous intensity E1 at ±15 degrees and a luminous intensity E2 at ±30 degrees.

The following Table 1 is a table for comparing the first angle θ1 of the side surface 116 of the recess 111 with respect to the optical axis Z of FIG. 6, and luminous efficiency and a luminous intensity ratio according to the shortest distance D between the side surface 116 of the light emitting diode 100 and the side surface 116 of the recess 111 when a shortest distance between the lower end of the side surface 116 of the recess 111 and a center of the light emitting diode 131 is X.

TABLE 1

| θ θ1 | X(mm) | Tan(θ1) × D | Efficiency (%) | Luminous intensity ratio (E0/E1) | Luminous intensity ratio (E0/E2) |
|---|---|---|---|---|---|
| 23.5 | 1.7 | 0.289949494 | 70.3573 | 1.01411 | 1.05177 |
| 23.5 | 1.8 | 0.33137085 | 71.177 | 1.007 | 1.0335 |
| 23.5 | 1.9 | 0.372792206 | 71.8535 | 1.00154 | 1.01891 |
| 23.5 | 2 | 0.414213562 | 72.4104 | 1.0011 | 1.00999 |
| 25 | 1.6 | 0.279784595 | 70.3702 | 1.01022 | 1.04856 |
| 25 | 1.7 | 0.326415361 | 71.2563 | 1.00353 | 1.0314 |
| 25 | 1.8 | 0.373046127 | 71.9775 | 1.0064 | 1.03162 |
| 25 | 1.9 | 0.419676892 | 72.5688 | 1.00636 | 1.01989 |
| 27.5 | 1.5 | 0.260283525 | 70.3046 | 1.01135 | 1.05936 |
| 27.5 | 1.6 | 0.31234023 | 71.2835 | 1.00904 | 1.04462 |
| 27.5 | 1.7 | 0.364396935 | 72.0645 | 1.00649 | 1.03608 |
| 27.5 | 1.8 | 0.41645364 | 72.7002 | 1.01224 | 1.03284 |
| 30 | 1.6 | 0.346410162 | 72.1145 | 1.00115 | 1.0394 |
| 30 | 1.7 | 0.404145188 | 72.7972 | 1.0001 | 1.03242 |
| 35 | 1.3 | 0.210062261 | 70.9272 | 1.00226 | 1.08709 |
| 35 | 1.4 | 0.280083015 | 72.0346 | 1.00348 | 1.07811 |

Here, a value obtained by multiplying the shortest distance D between a side surface P1 of the light emitting diode 131 and the lower end P2 of the side surface of the recess 111 of the body 110 by a value of a tangent θ1 of the side surface 116 may range from 0.21 to 0.42. That is, it can be seen that, when the value obtained by multiplying the distance D by the value of the tangent θ1 of the side surface 116 ranges from 0.21 to 0.42, the central luminous intensity E0 of the light emitting device 100 is higher than the ambient luminous intensities E1 and E2 and the luminous efficiency is 70% or higher, as shown in FIGS. 15 to 17. Here, it can be seen that the central luminous intensity is high because ratios of the central luminous intensity E0 to the ambient luminous intensities E1 and E2 are 1 or more.

The following Table 2 shows a Lambertian distribution of the light emitted from the recessed structure of the light emitting device having the recessed structure in the following Examples 1, 2, and 3 in Table 1, as shown in FIGS. 15 to 17.

TABLE 2

| | θ1 | X(mm) | Tan(θ1) × D | Efficiency (%) | Luminous intensity ratio (E0/E1) | Luminous intensity ratio (E0/E2) |
|---|---|---|---|---|---|---|
| Example 1 | 23.5 | 2 | 0.414213562 | 72.4104 | 1.0011 | 1.00999 |
| Example 2 | 27.5 | 1.6 | 0.31234023 | 71.2835 | 1.00904 | 1.04462 |
| Example 3 | 35 | 1.4 | 0.280083015 | 72.0346 | 1.00348 | 1.07811 |

In Example 1 of the light emitting device, it can be seen that luminous efficiency is about 72% and ratios E0/E1 and E0/E2 of the central luminous intensity E0 to the ambient luminous intensities (E1 and E2) are 1 or more as shown in FIG. 15 when the first angle θ1 of the side surface 116 of the recess 111 of the body 110 is 23.5 degrees with respect to the optical axis Z and the shortest distance between the side surface P1 of the light emitting diode 131 and the lower end P2 of the side surface 116 of the recess is 1 mm.

In Example 2 of the light emitting device, it can be seen that luminous efficiency is about 71% and ratios E0/E1 and E0/E2 of the central luminous intensity E0 to the ambient luminous intensities (E1 and E2) are 1 or more as shown in FIG. 16 when the first angle θ1 of the side surface 116 of the recess 111 of the body 110 is 27.5 degrees with respect to the optical axis Z and the shortest distance D between the side surface P1 of the light emitting diode 131 and the lower end P2 of the side surface 116 of the recess is 0.6 mm.

In Example 3 of the light emitting device, it can be seen that luminous efficiency is about 71% and ratios E0/E1 and E0/E2 of the central luminous intensity E0 to the ambient luminous intensities E1 and E2 are 1 or more as shown in FIG. 17 when the first angle θ1 of the side surface 116 of the recess 111 of the body 110 is 27.5 degrees with respect to the optical axis Z and a minimum distance D between the side surface P1 of the light emitting diode 131 and the lower end P2 of the side surface 116 of the recess is 0.6 mm.

According to the embodiment, the ultraviolet light emitting device having a high luminous efficiency and a central luminous intensity higher than an ambient luminous intensity may be provided, and thus may be applied to various applications.

Second Embodiment

Figure 8:
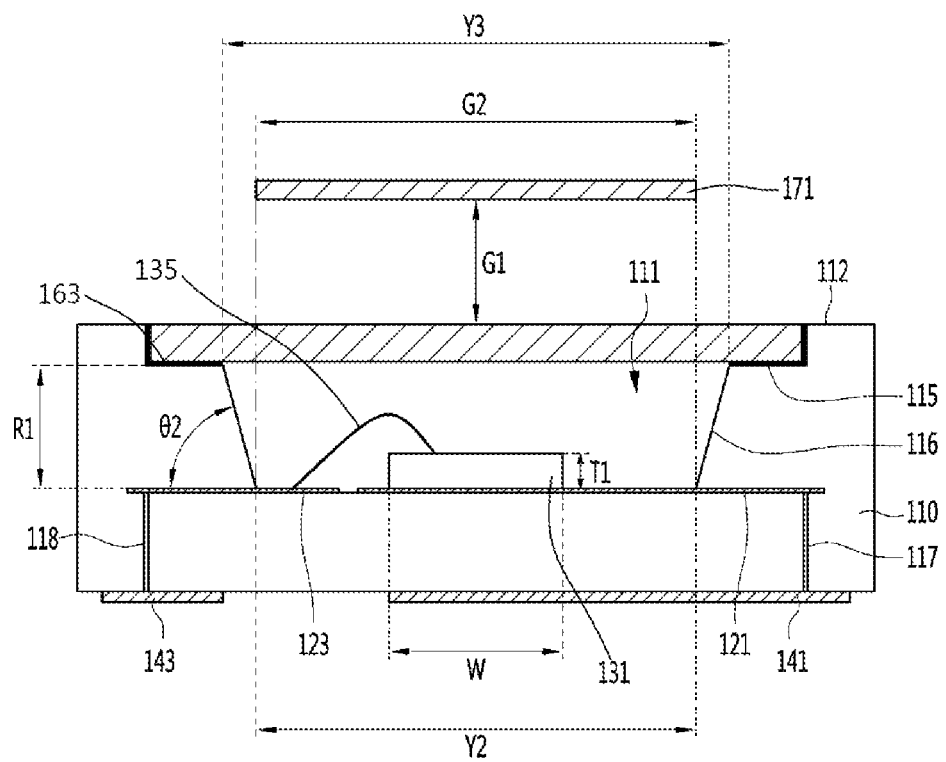
FIG. 8 is a side cross-sectional view taken along line A-A of the light emitting device of FIG. 1 according to a second embodiment.
Figure 9:
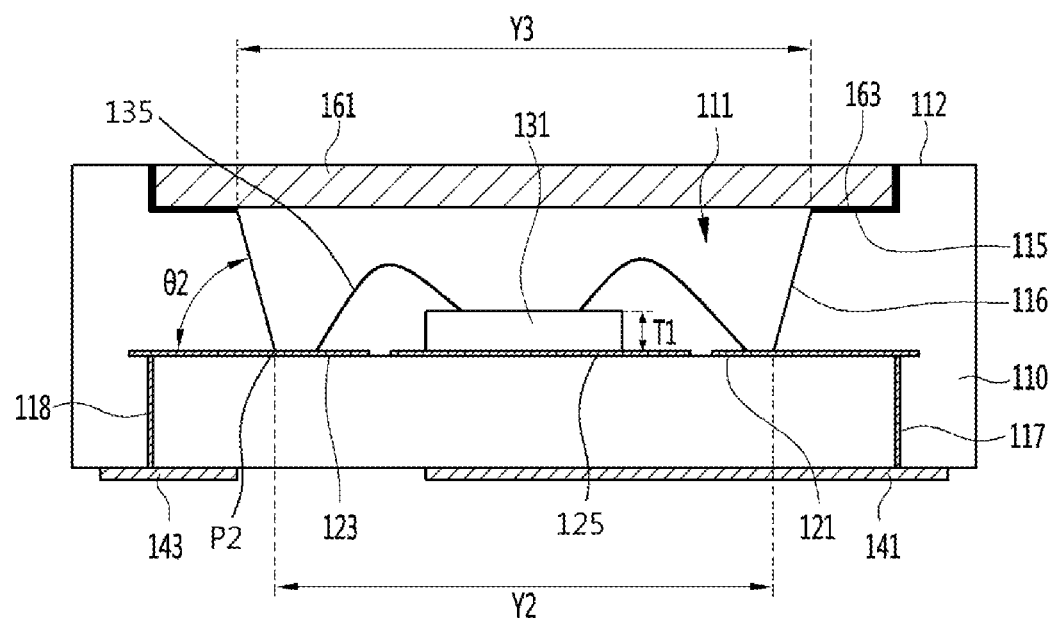
FIG. 9 is a side cross-sectional view showing another example of the light emitting device of FIG. 8.
Figure 10:
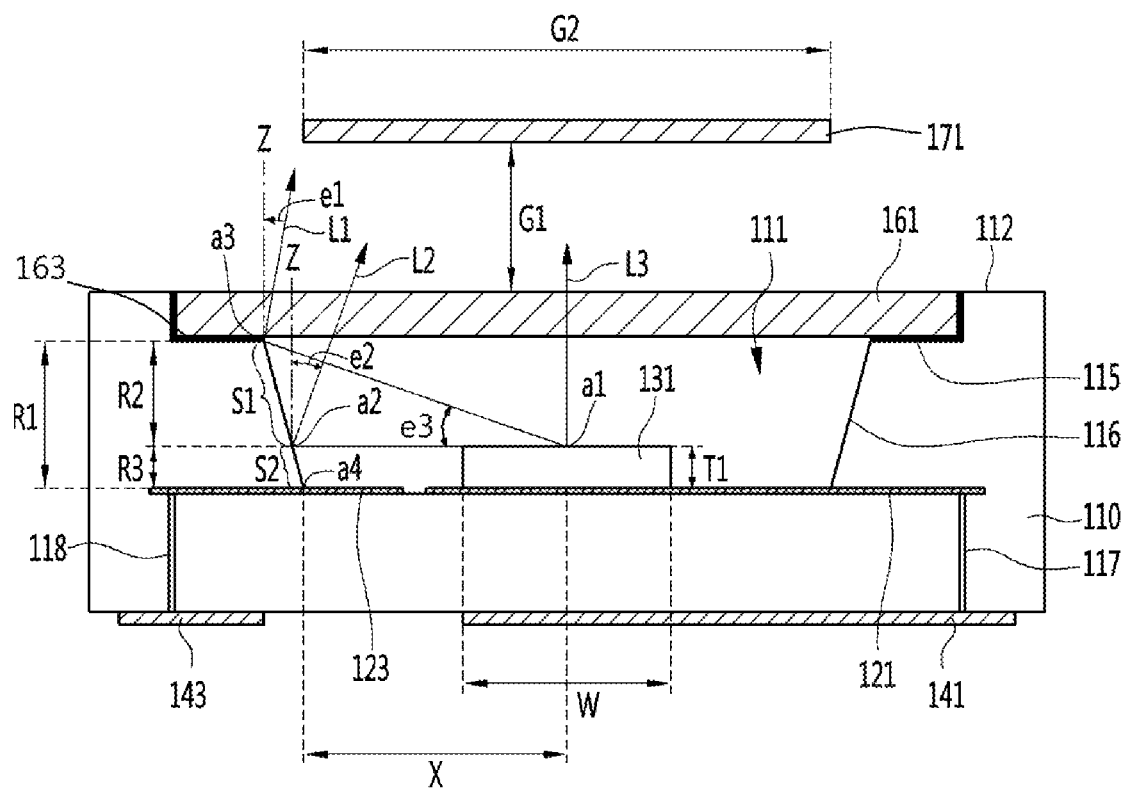
FIG. 10 is a partially enlarged view of FIG. 8, which is a view for describing a region of a side surface of a recess.

FIGS. 8 to 10 are views showing a light emitting device according to a second embodiment. In describing the second embodiment, the same configuration as the first embodiment may refer to the description of that of the first embodiment and may be optionally applied to the second embodiment.

Referring to FIGS. 8 to 10, a light emitting device 100 includes a body 110 having a recess 111, a plurality of electrodes 121 and 123 disposed in the recess 111, a light emitting diode 131 disposed on at least one of the plurality of electrodes 121 and 123, and an optical film 161 disposed on the recess 111.

The light emitting diode 131 may include a peak wavelength which is optional in a wavelength range from ultraviolet rays to visible light. The light emitting diode 131 may emit an ultraviolet C (UV-C) wavelength, for example, a wavelength in a range from 100 nm to 400 nm. The light emitting diode 131 may be an ultraviolet light emitting diode, and may be an ultraviolet light emitting diode having a wavelength in a range from 100 nm to 400 nm. When the light emitting diode 131 emits a short wavelength of, for example, 280 nm or less, the wavelength of the ultraviolet rays has an effect of reducing various biological contaminants such as germs, bacteria, viruses, and the like. The light emitting diode 131 may be bonded to a first electrode 121 using a conductive adhesive and may be connected to a second electrode 123 using a first connecting member 135. The light emitting diode 131 may be electrically connected to the first electrode 121 and the second electrode 123. The light emitting diode 131 may be formed of a compound semiconductor of an element of Group II and Group VI or a compound semiconductor of an element of Group III and Group V. For example, the light emitting diode 131 may selectively include a semiconductor light emitting device manufactured by using a compound semiconductor, such as AlInGaN, InGaN, AlGaN, GaN, GaAs, InGaP, AlInGaP, InP, or InGaAs series. The light emitting diode 131 may include an N-type semiconductor layer, a P-type semiconductor layer, and an active layer. The active layer may be implemented with compound semiconductors in pairs, such as InGaN/GaN, InGaN/AlGaN, InGaN/InGaN, GaN/AlGaN, InAlGaN/InAlGaN, AlGaAs/GaAs, InGaAs/GaAs, InGaP/GaP, AlInGaP/InGaP, and InP/GaAs. A thickness T1 of the light emitting diode 131 may be in a rage of 0.12 mm±0.03 mm and a width W may be in a range of 1.3 mm±0.4 mm, but the present invention is not limited thereto.

When the light emitting device 100 having the light emitting diode 131 is applied to an apparatus such as an exposure apparatus or a curing apparatus, it is required to improve luminous efficiency or uniformity in a specific region. However, in the case of the light emitting device (Comparative Example) in which the side surface of the recess in the body is made of a ceramic material and is formed vertically, efficiency with which light emitted from the light emitting diode is incident on a surface of a target 171 is smaller than 30%, and the uniformity of the light is as low as 75% or less. Therefore, there is a problem in that reliability of an exposure apparatus or a curing apparatus to which the light emitting device in Comparative Example is applied may be lowered. When a plurality of light emitting diodes are employed in order to improve the luminous efficiency and the uniformity, a problem of increase in manufacturing cost and process may be caused.

According to the embodiment, in order to solve the above-described problem, a side surface 116 of the recess 111 of the body 110 is provided to be inclined and a specular reflective surface is partially disposed on the inclined side surface 116, and thus luminous intensity at a specific angle may be increased and uniformity in the region of the target 171 may be improved.

Referring to FIG. 8, in a recessed structure of the body 110 of the light emitting device 100 according to the embodiment, the recess 111 of the body 110 may include a bottom and a plurality of side surfaces 116. The light emitting diode 131 may be disposed on a central portion of the bottom of the recess 111. Each of side surfaces of the light emitting diode 131 may be disposed at equal intervals from the side surfaces of the recess 111.

A width Y3 of an upper portion of the recess 111 may be wider than a width Y2 of the bottom of the recess 111. The width of the recess 111 may gradually increase from the bottom of the recess toward the optical film 161 or the stepped structure 115. The side surfaces 116 of the recess 111 may be inclined at a predetermined angle θ2 with respect to a horizontal extension line of the bottom of the recess 111. The inclined angle θ2 may range from 40 degrees to 70 degrees, for example, from 45 degrees to 68 degrees. There is a problem in that a luminous intensity to the target 171 and luminous efficiency are lowered when the angle θ2 of the side surface 116 is greater or smaller than the above range. Here, the target 171 may be an optical lens or a reflective surface by which a path of light is changed to another direction.

A shortest distance from the side surface 116 of the recess 111, for example, a lower end of the side surface 116, to the side surface of the light emitting diode 131 may be 1 mm or less, for example, may range from 0.3 mm to 1 mm. There is a problem in that, when the shortest distance is greater than 1 mm, the luminous intensity and the luminous efficiency of the light emitted from the light emitting device 100 in the target 171 may be lowered, and when the shortest distance is smaller than 0.3 mm, the luminous efficiency of the light emitting device 100 is lowered. According to the embodiment, a recessed structure in which the inclined angle θ2 of the side surface 116 of the recess 111, the shortest distance, and a region of the specular reflective surface of the side surface 116 are optimized may be provided, and thus the luminous intensity and the luminous efficiency to a specific region can be improved. Due to the light emitted from the light emitting device 100 according to the embodiment, the recessed structure in which the luminous efficiency in the target 171 is 30% or higher and the light uniformity is 80% or higher may be provided.

Referring to FIG. 10, the side surface 116 of the recess 111 of the body 110 may have a different reflection characteristic according to a region. For example, a first region S1 adjacent to the optical film 161 may be a specular reflective surface and a second region S2 between the first region S1 and the bottom of the recess 111 may be a scattered reflective surface. The first region S1 may be an upper region at the side surface 116 and the second region S2 may be a lower region at the side surface 116. The first region S1 is disposed at an upper periphery of the plurality of side surfaces 116 and the second region S2 may be disposed at a lower periphery of the plurality of side surfaces 116.

An upper end point a3 of the first region S1 may be an upper end of the side surface 116 of the recess 111, and a lower end point a2 may be a point which intersects a virtual straight line extending horizontally from an upper surface of the light emitting diode 131 or may be positioned above the intersecting point. The second region S2 may be disposed below a virtual straight line with respect to the upper surface of the light emitting diode 131. The first region S1 may be a region which does not face the side surface of the light emitting diode 131 and the second region S2 may be a region which faces the side surface of the light emitting diode 131. The first region S1 may be disposed at a height to be spaced apart from the bottom of the recess 111 by the thickness T1 or more of the light emitting diode 131. The specular reflective surface may be a metal coated layer such as a silver (Ag) coated layer and the scattered reflective surface may be formed of a material of the body 110 or a ceramic material, or may be coated with a diffusing agent. An area of the first region S1 on the side surface 116 of the recess 111 may be greater than an area of the second region S2. A height R2 of the first region S1 may be greater than a height R3 of the second region S2. A ratio of a depth R1 of the recess 111 to the height R2 of the first region S1 may range from 1:0.7 to 1:0.8 and a ratio of the depth R1 of the recess 111 to the height R3 of the second region S2 may range from 1:0.2 to 1:0.3. A ratio of the height R2 to the height R3 (R2:R3) may be 2.5:1 or more, for example, may range from 2.5:1 to 3.5:1. The heights R2 and R3 of the first and second regions S1 and S2 may vary according to the thickness T1 of the light emitting diode 131, but the present invention is not limited thereto. The depth R1 of the recess 111 may be in a range of 1.2 mm±0.2 mm, and may vary according to the thickness T1 of the light emitting diode 131. The first and second regions S1 and S2 may be inclined at the same angle as the inclined angle of the side surface 116.

Here, rays of light among the light emitted from the light emitting diode 131, which can affect the luminous efficiency and the luminous intensity of the target 171, may include a third light L3 traveling in a direction of an optical axis, a second light L2 reflected by the lower end point a2 of the first region S1, and a first light L1 traveling toward the upper end point a3 of the first region S1.

The second light L2 travels to the lower end point a2 of the first region S1 and then is reflected at a second exit angle e2 with respect to the optical axis Z, and the reflected light L2 passes through the optical film 161 to travel toward the target 171. In this case, a traveling path of the second light L2 may be changed to the target 171, so that the luminous intensity and luminous efficiency at the target 171 can be improved.

The first light L1 travels to the upper end point a3 of the first region S1 and then is reflected at a first exit angle e1 with respect to the optical axis Z, and the reflected light L1 passes through the optical film 161 to travel toward an edge region of the target 171. In this case, a traveling path of the first light L1 may be changed to the edge region of the target 171, so that the luminous intensity and the luminous efficiency at the target 171 can be improved. The ranges of the exit angles e1 and e2 of light in the first region S1 and the inclined angle θ2 (see FIG. 10) may be optimized, so that an effective angle of light that can be incident on the target 171 may be maximized. Here, the effective angle of the light emitted from the light emitting device 100 is an angle at which light is incident on a region of the target 171 spaced a predetermined distance from the light emitting device 100, and may be a maximum angle at which light is incident on the edge of the target 171. Due to the effective angle, the luminous intensity and the luminous efficiency at the target 171 can be improved.

Here, the lower end point a2 of the first region S1 may be a boundary point between a specular reflective surface and a scattered reflective surface and may be positioned at the same height as a center a1 of the upper surface of the light emitting diode 131 from the bottom of the recess. For example, in the case in which a condition a2≥0 is satisfied, when lower end point a2 is 0, there is no difference in height between the lower end point a2 and the center a1 of the upper surface of the light emitting diode 131, and when a2>0, the lower end point a2 is positioned higher than the center a1 of the upper surface of the light emitting diode 131.

X is smaller or too much greater than the above range, it is difficult to control the traveling path of the light to the direction of the target.

Referring to FIG. 10, the point a1 is the center of the upper surface of the light emitting diode 131, the first region S1 of the side surface 116 is a specular reflective surface, and the second region S2 is a scattered reflective surface. The angle e1 is an angle, at which light enters an uppermost point of the first region S1 from the center a1 of the upper surface of the light emitting diode 131 is regularly reflected and is emitted using the optical axis Z as a normal vector. The angle e2 is an angle, at which light entered from the center a1 of the upper surface of the light emitting diode 131 is regularly reflected at the lower end point a2 of the first region S1 and is emitted using the optical axis Z as a normal vector.

The following Table 3 shows experimental values of parameters for luminous efficiency and illumination efficiency in the light emitting device according to the embodiment. Here, an experiment has been performed on the light emitting diode 131 having a length of 1.30 mm in horizontal and vertical directions and a thickness of 0.12 mm, under a condition that a distance G1 between the target 171 and the optical film 161 is 500 mm and a length G2 of the target 171 in horizontal and vertical directions is 500 mm.

TABLE 3

| X | a2 | θ1 | Efficiency (%) | Uniformity | Illumination efficiency | e1 | e2 | Exit angle difference | e1 luminous intensity | e2 luminous intensity |
|---|---|---|---|---|---|---|---|---|---|---|
| 1.3 | 0 | 45 | 74.65 | 0.850 | 0.305 | −23.7 | 0 | 23.7 | 1.831 | 2 |
| 1.3 | 0.1 | 45 | 74.68 | 0.845 | 0.300 | −23.7 | −3.8 | 19.9 | 1.831 | 1.995 |
| 1.9 | 0 | 63.44 | 74.49 | 0.858 | 0.3010 | 13.1 | 36.8 | 23.7 | 1.889 | 1.8 |
| 1.9 | 0.1 | 63.44 | 74.53 | 0.855 | 0.303 | 13.1 | 34.0 | 20.9 | 1.889 | 1.828 |
| 1.9 | 0.2 | 63.44 | 74.58 | 0.849 | 0.3035 | 13.1 | 31.3 | 18.2 | 1.889 | 1.850 |
| 1.9 | 0.3 | 63.44 | 74.64 | 0.837 | 0.3017 | 13.1 | 28.7 | 15.6 | 1.889 | 1.867 |

That is, the height of the lower end point a2 may be higher than or equal to the height of the upper surface of the light emitting diode 131. The upper end point a3 of the first region S1 may be disposed higher than the center a1 of the upper surface of the light emitting diode 131 with a height difference of 1.1 mm±0.2 mm. When a difference between the height of the upper end point a3 of the first region S1 and the height of the upper surface of the light emitting diode 131 is smaller than the height difference of 1.1 mm±0.2 mm, the luminous intensity and the luminous efficiency in the first region S1 may be lowered and overall luminous efficiency of the light emitting device may be lowered. When the difference between the height of the upper end point a3 of the first region S1 and the height of the upper surface of the light emitting diode 131 is greater than the height difference of 1.1 mm±0.2 mm, there is a problem in that the first light L1 may be out of the edge region of the target 171. The upper end point a3 may be changed according to the depth R1 of the recess 111 and the thickness T1 of the light emitting diode 131.

An exit angle e3 of the light which travels toward the first region S1 through the center a1 of the upper surface of the light emitting diode 131 with respect to a distance X between a center of the light emitting diode 131 and a lower end a4 of the side surface of the recess 111 may range from 0 degrees to 25 degrees. Here, a value of the distance X may be 2.1 mm or less, for example, may range from 1.7 mm to 2.1 mm or 1.4 mm to 2.0 mm. When the value of the distance The a2 denotes the lower end point of the first region S1 and is the same position as the interval between the center a1 of the upper surface of the light emitting diode and the bottom of the recess. An exit angle difference is an absolute value of e1−e2 and has 0 or a positive value.

The luminous intensity of the first exit angle e1 may be a luminous intensity due to the first light L1, the luminous intensity of the second exit angle e2 may be a luminous intensity due to the second light L2, and the luminous intensity of the exit angle may be a sum of the luminous intensity of the light specularly reflected by the first region S1 and the luminous intensity of the light incident from the light emitting diode in the direction of the optical axis. Illumination efficiency (EEF) is luminous efficiency of light which enters the target surface, and uniformity of light is a ratio of an average value of illumination of the target to a maximum value of the illumination of the target.

Here, the EEF may be efficiency for a desired value of illumination with respect to the light emitting diode and a value of 0.3 or more may be obtained, light uniformity may be 0.8 or more, an exit angle difference may be an absolute value of e1−e2 and may be 17 degrees or more, for example, may range from 17 degrees to 24 degrees, and luminous intensities of the exit angles e1 and e2 may range from 1.8 to 2. Here, any one or a higher one of the exit angles e1 and e2 may be 20 degrees or more.

Due to the light emitted from the light emitting device 100 according to the second embodiment, a recessed structure in which luminous efficiency at the target 171 is 30% or higher and light uniformity is 80% or higher may be provided. According to the embodiment, the luminous intensity and the luminous efficiency at the target 171 with respect to ultraviolet rays emitted from the light emitting device may be improved, and thus the light emitting device 100 may be applied to various applications. As another example, the light emitting diode according to the embodiment may emit visible light, for example, blue, green, red, or white light rather than ultraviolet rays, but the present invention is not limited thereto.

Figure 11:
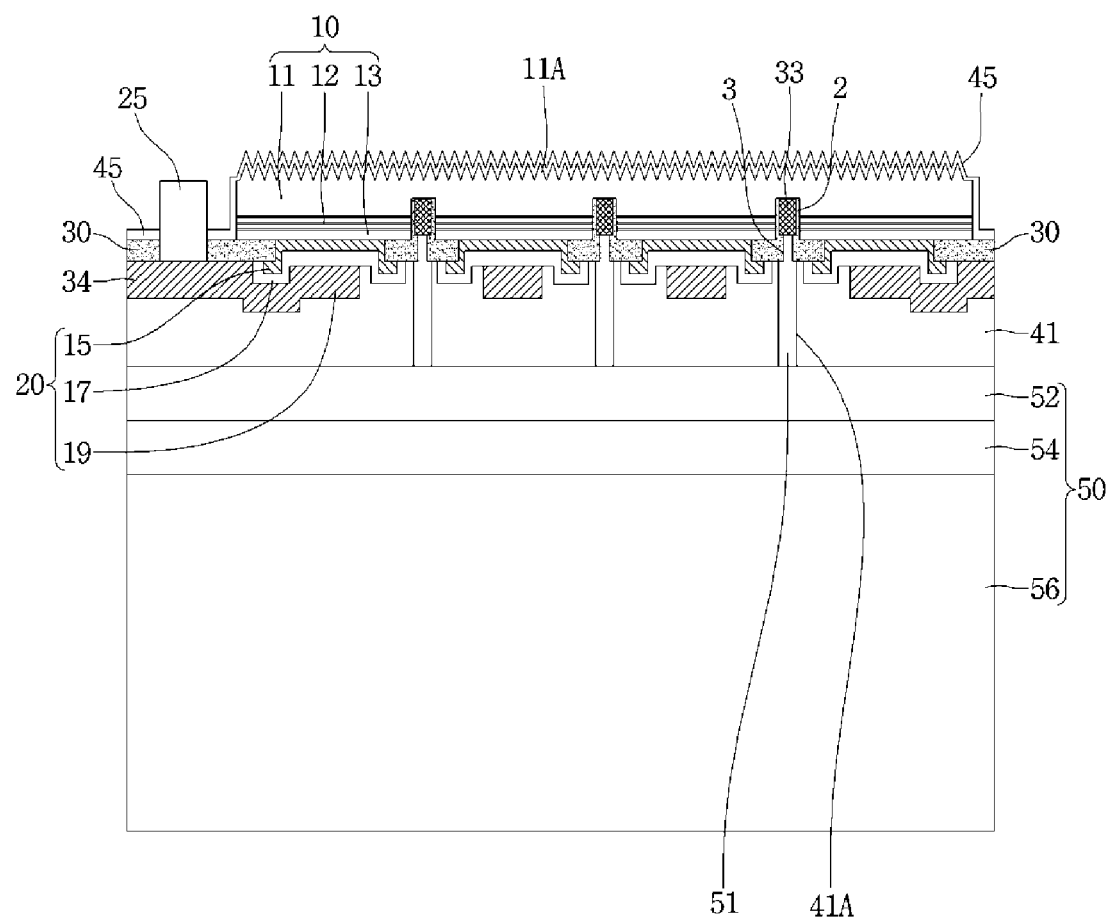
FIG. 11 is a view for describing an example of the light emitting diode according to an embodiment.

FIG. 11 is a view illustrating another example of a light emitting diode according to an embodiment.

Referring to FIG. 11, the light emitting diode may include a light emitting structure 10 including a plurality of semiconductor layers 11, 12 and 13, a first electrode layer 20 under the light emitting structure 10, a second electrode layer 50 under the first electrode layer 20, an insulation layer 41 between the first and second electrode layers 20 and 50, and a pad 25.

The light emitting structure 10 may include a first semiconductor layer 11, an active layer 12, and a second semiconductor layer 13. The active layer 12 may be disposed between the first semiconductor layer 11 and the second semiconductor layer 13. The active layer 12 may be disposed under the first semiconductor layer 11, and the second semiconductor layer 13 may be disposed under the active layer 12.

For example, the first semiconductor layer 11 may include an n-type semiconductor layer to which a first conductive type dopant, e.g., an n-type dopant is added, and the second semiconductor layer 13 may include a p-type semiconductor layer to which a second conductive type dopant, e.g., a p-type dopant is added. On the other hand, the first semiconductor layer 11 may be provided as a p-type semiconductor layer, and the second semiconductor layer 13 may be provided as an n-type semiconductor layer.

The light emitting structure 10 is selectively formed of a compound semiconductor of group II to V elements and group III to V elements and is capable of emitting a predetermined peak wavelength within a wavelength range from the ultraviolet band to the visible light band, For example, ultraviolet light can be emitted. The light emitting structure 10 may include the first semiconductor layer 11, the second semiconductor layer 13, and the active layer 12 between the first and second semiconductor layers 11 and 13. Other semiconductor layer may be disposed at least one of the layers 11, 12, and 13, but the invention is not limited thereto.

The first semiconductor layer 11 includes a compositional formula of $In_xAl_yGa_{1-x-y}N$ ($0 \leq x \leq 1$, $0 \leq y \leq 1$, $0 \leq x+y \leq 1$). The first semiconductor layer 11 may be realized with at least one of a group II-VI compound semiconductor and a group III-V compound semiconductor. For instance, the first semiconductor layer 11 may be selected from the group consisting of GaN, AlN, AlGaN, InGaN, InN, InAlGaN, AlInN, AlGaAs, GaP, GaAs, GaAsP, and AlGaInP. The first conductive dopant includes an n type dopant such as Si, Ge, Sn, Se, or Te.

The active layer 12 may be disposed under the first semiconductor layer 11 and may have at least one of a single quantum well structure, a multiple quantum well (MQW) structure, a quantum dot structure, or a quantum wire structure, but the embodiment is not limited thereto. The active layer 12 includes a pair of a well layer and a barrier layer. The pair of the well layer and the barrier layer, for example, includes at least one pairs of InGaN/GaN, GaN/AlGaN, AlGaN/AlGaN, InGaN/AlGaN, InGaN/InGaN, AlGaAs/GaA, InGaAs/GaAs, InGaP/GaP, AlInGaP/InGaP, and InP/GaAs.

The second semiconductor layer 13 may be disposed under the active layer 12. The second semiconductor layer 13 includes a semiconductor with a second conductive type dopant, for example, a compositional formula of $In_xAl_yGa_{1-x-y}N$ ($0 \leq x \leq 1$, $0 \leq y \leq 1$, $0 \leq x+y \leq 1$). The second semiconductor layer 13 may be selected from the group consisting of GaN, AlN, AlGaN, InGaN, InN, InAlGaN, AlInN, AlGaAs, GaP, GaAs, GaAsP, and AlGaInP. The second semiconductor layer 13 is a p-type semiconductor layer with a p-type dopant such as Mg, Zn, Ca, Sr, or Ba.

A rough unevenness 11A may be disposed on a top surface of the first semiconductor layer 11, and the unevenness surface 11A may improve light extraction efficiency. The unevenness surface 11A may have a lateral cross-section with a polygonal shape or a hemispherical shape.

The first electrode layer 20 is disposed between the light emitting structure and the second electrode layer 50 and electrically connected to the second semiconductor layer 13 of the light emitting structure 10 and also electrically connected to the second electrode layer 50. The first electrode layer 20 includes a first contact layer 15, a reflective layer 17, and a capping layer 19. The first contact layer 15 is disposed between the reflective layer 17 and the second semiconductor layer 13, and the reflective layer 17 is disposed between the first contact layer 15 and the capping layer 19. The first contact layer 15, the reflective layer 17, and the capping layer 19 may be made of different conductive materials, but is not limited thereto.

The first contact layer 15 may come into contact with the second semiconductor layer, for example, come into ohmic-contact with the second semiconductor layer 13. The first contact layer 15 may be made of, for example, a conductive oxide film, conductive nitride, or a metal. The first contact layer 15 may be made of at least one of indium tin oxide (ITO), ITO nitride (ITON), indium zinc oxide (IZO), IZO nitride (IZON), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, Pt, Ag, and Ti.

The reflective layer 17 may be electrically connected to the first contact layer 15 and the capping layer 19. The reflective layer 17 may reflect light incident from the light emitting structure 10 to perform a function for increasing an amount of light extracted to the outside.

The reflective layer 17 may be made of a metal having light reflectivity of 70% or more. For example, the reflective layer 17 may be made of a metal including at least one of Ag, Ni, Al, Rh, Pd, Ir, Ru, Mg, Zn, Pt, Au and Hf or an ally thereof. Also, the reflective layer 17 may be realized as a multi-layer using the above-described metal or an alloy and a light transmissive conductive material such as indium-tin-oxide (ITO), indium-zinc-oxide (IZO), indium-zinc-tin-oxide (IZTO), indium-aluminum-zinc-oxide (IAZO), indium-gallium-zinc-oxide (IGZO), indium-gallium-tin-oxide (IGTO), aluminum-zinc-oxide (AZO), or antimony-tin-oxide (ATO).

For example, the reflective layer 17 according to an embodiment may include at least one of Ag, Al, an Ag—Pd—Cu alloy, or an Ag—Cu alloy. For example, the reflective layer 17 may have a structure in which an Ag layer and an Ni layer are alternately disposed or may include an Ni/Ag/Ni or Ti layer and a Pt layer. For another example, the first contact layer 15 may be disposed under the reflective layer 17, and at least a portion of the first contact layer 15 may pass through the reflective layer 17 to come into contact with the second semiconductor layer 13. For another example, the reflective layer 17 may be disposed under the first contact layer 15, and a portion of the reflective layer 17 may pass through the first contact layer 15 to come into contact with the second semiconductor layer 13.

The light emitting diode according to an embodiment may include a capping layer 19 disposed under the reflective layer 17. The capping layer 19 comes into contact with a bottom surface of the reflective layer 17, and a contact part 34 is coupled to a pad 25 to function as a line layer for transmitting power supplied to the pad 25. The capping layer may be made of a metal, for example, at least one of Au, Cu, Ni, Ti, Ti—W, Cr, W, Pt, V, Fe, and Mo.

The contact part 34 of the capping layer 19 is disposed in a region, which does not vertically overlap the light emitting structure 10, to vertically overlap the pad 25. The contact part 34 of the capping layer 19 is disposed in a region which does not vertically overlap the first contact layer 15 and the reflective layer 17. The contact part 34 of the capping layer 19 is disposed at a position lower than that of the light emitting structure 10 to come into direct contact with the pad 25.

The pad 25 may be provided as a single layer or multilayered structure. The single layer may be made of Au, and when the pad 25 is provided as the multilayered structure, the pad 25 may include at least two materials of Ti, Ag, Cu, and Au. Here, in case of the multilayered structure, a laminated structure of Ti/Ag/Cu/Au or a laminated structure of Ti/Cu/Au may be provided. At least one of the reflective layer 17 and the first contact layer 15 may come into direct contact with the pad 25, but is not limited thereto.

The pad 25 may be disposed at a region between an outer wall of the first electrode layer 20 and the light emitting structure 10. The protection layer 30 and the light transmissive layer 45 may come into contact with a periphery of the pad 25.

The protection layer 30 may be disposed on a bottom surface of the light emitting structure 10 to come into contact with a bottom surface of the second semiconductor layer 13 and the first contact layer 15 and also come into contact with the reflective layer 17.

An inner portion, which vertically overlaps the light emitting structure 10, of the protection layer 30 may be disposed to vertically overlap a region of the protrusion 16. An outer portion of the protection layer 30 may extend upward from the contact part 34 of the capping layer 19 and be disposed to vertically overlap the contact part 34. The outer portion of the protection layer 30 may come into contact with the pad 25, for example, be disposed on a circumferential surface of the pad 25.

The inner portion of the protection layer 30 may be disposed between the light emitting structure 10 and the first electrode layer 20, and the outer portion may be disposed between the light transmissive layer 45 and the contact part 34 of the capping layer 45. The outer portion of the protection layer 30 may extend from a side wall of the light emitting structure 10 to an external region A1 to prevent moisture from being permeated.

The protection layer 30 may be defined as a channel layer, a low refractive index material layer, or an isolation layer. The protection layer 30 may be made of an insulation material, e.g., oxide or nitride. For example, the protection layer 30 may be made of at least one material selected from the group consisting of SiO2, SixOy, Si3N4, SixNy, SiOxNy, Al2O3, TiO2, and AlN. The protection layer 30 may be made of a transparent material.

The light emitting diode according to an embodiment may include an insulation layer for electrically insulating the first electrode layer 20 from the second electrode layer 50. The insulation layer 41 may be disposed between the first electrode layer 20 and the second electrode layer 50. An upper portion of the insulation layer 41 may come into contact with the protection layer 30. The insulation layer 41 may be made of, for example oxide or nitride. For example, the insulation layer 41 may be made of at least one material selected from the group consisting of SiO2, SixOy, Si3N4, SixNy, SiOxNy, Al2O3, TiO2, and AlN.

The insulation layer 41 may have, for example, a thickness of 100 nanometers to 2,000 nanometers. When the insulation layer 41 has a thickness of 100 nanometers or less, insulation characteristics may be deteriorated. When the insulation layer 41 has a thickness exceeding 2,000 nanometers, cracking may occur in the post-process. The insulation layer 41 may come into contact with a bottom surface of the first electrode layer 20 and a top surface of the second electrode layer 50 and thus have a thickness greater than that of each of the protection layer 30, the capping layer 19, the contact layer 15, and the reflective layer 17.

The second electrode layer 50 may include a diffusion barrier layer 52 disposed under the insulation layer 41, a bonding layer 54 disposed under the diffusion barrier layer 52, and a conductive support member 56 disposed under the bonding layer 54 and be electrically connected to the first semiconductor layer 11. Also, the second electrode layer 50 may selectively include one or two of the diffusion barrier layer 52, the bonding layer 54, and the conductive support member 56. At least one of the diffusion barrier layer 52 and the bonding layer 54 may be omitted.

The diffusion barrier layer 52 may be made of at least one of Au, Cu, Ni, Ti, Ti—W, Cr, W, Pt, V, Fe, and Mo. The diffusion barrier layer 52 may function as a diffusion barrier between the insulation layer 41 and the bonding layer 54. The diffusion barrier layer 52 may be electrically connected to the bonding layer 54 and the conductive support member 56 and also electrically connected to the first semiconductor layer 11.

The diffusion barrier layer 52 may perform a function for preventing a material contained in the bonding layer 54 from being diffused in a direction of the reflective layer 17 when the bonding layer 54 is manufactured. The diffusion barrier layer 52 may prevent a material such as tin (Sn) contained in the bonding layer 54 from having an influence on the reflective layer 17.

The bonding layer 54 may be made of a barrier metal or bonding metal, for example, at least one of Ti, Au, Sn, Ni, Cr, Ga, In, Bi, Cu, Ag, Nb, Pd, or Ta. The conductive support member 56 may perform a heat dissipation function by supporting the light emitting structure 10 according to an embodiment. The bonding layer 54 may include a seed layer.

The conductive support member 56 may be formed by using a metal or a carrier substrate, for example, a semiconductor substrate (e.g., Si, Ge, GaN, GaAs, ZnO, SiC, and SiGe) into which Ti, Cr, Ni, Al, Pt, Au, W, Cu, Mo, Cu—W or an impurity is injected. The conductive support member 56 may be a layer for supporting the light emitting diode and have a thickness corresponding to 80% of a thickness of the second electrode layer 50, i.e., a thickness of 30 μm or more.

The second contact layer 33 is disposed in the first semiconductor layer 11 to come into contact with the first semiconductor layer 11. A top surface of the second contact layer may be disposed at a position higher than a bottom surface of the first semiconductor layer 11, electrically connected to the first semiconductor layer 11, and insulated from the active layer 12 and the second semiconductor layer 13.

The second electrode 33 may be electrically connected to the second conductive layer 50. The second contact layer 33 may be disposed to pass through the first electrode layer 20, the active layer 12, and the second semiconductor layer 15. The second contact layer 33 may be disposed in a recess 2 defined in the light emitting structure 10 and insulated from the active layer 12 and the second semiconductor layer 15 by the protection layer 30. The second contact layer 33 may be provided in plurality, and the plurality of second contact layers 33 may be spaced apart from each other.

The second contact layer 33 may be connected to a protrusion 51 of the second electrode layer 50, and the protrusion 51 may protrude from the diffusion barrier layer 52. The protrusion 51 may pass through a hole 41A defined in the insulation layer 41 and the protrusion layer 30 and be insulated from the first electrode layer 20.

The second contact layer 33 may be made of at least one of Cr, V, W, Ti, Zn, Ni, Cu, Al, Au, and Mo. For another example, the protrusion 51 may include at least one of the materials forming the diffusion barrier layer 52 and the bonding layer 54, but is not limited thereto. For example, the protrusion 51 may include at least one of Ti, Au, Sn, Ni, Cr, Ga, In, Bi, Cu, Ag, Nb, Pd or Ta.

The pad 25 is electrically connected to the first electrode layer 20 and exposed to the region outside the sidewall of the light emitting structure 10. The pad 25 may be provided in one or plurality. For example, the pad 25 may be made of at least one of Au, Cu, Ni, Ti, Ti—W, Cr, W, Pt, V, Fe, and Mo.

The light transmissive layer 45 may protect a surface of the light emitting structure 10, insulate the pad 25 from the light emitting structure 10, and come into contact with a peripheral portion of the protection layer 30. The light transmissive layer 45 may have a refractive index less than that of the semiconductor layer constituting the light emitting structure 10 to improve the light extraction efficiency. The light transmissive layer 45 may be made of, for example, oxide or nitride. For example, the light transmissive layer 45 may be made of at least one material selected from the group consisting of $SiO_2$, $Si_xO_y$, $Si_3N_4$, $Si_xN_y$, $SiO_xN_y$, $Al_2O_3$, $TiO_2$, and AlN. The light transmissive layer 45 may be omitted according to a design. According to an embodiment, the light emitting structure 10 may be driven by the first electrode layer 20 and the second electrode layer 50.

In the light-emitting device according to an embodiment, the deterioration of the center-side illuminance distribution may be inhibited in the camera module to improve the illuminance distribution in the corner region, particularly, the corner region. Therefore, the entire light uniformity may be improved.

Figure 12:
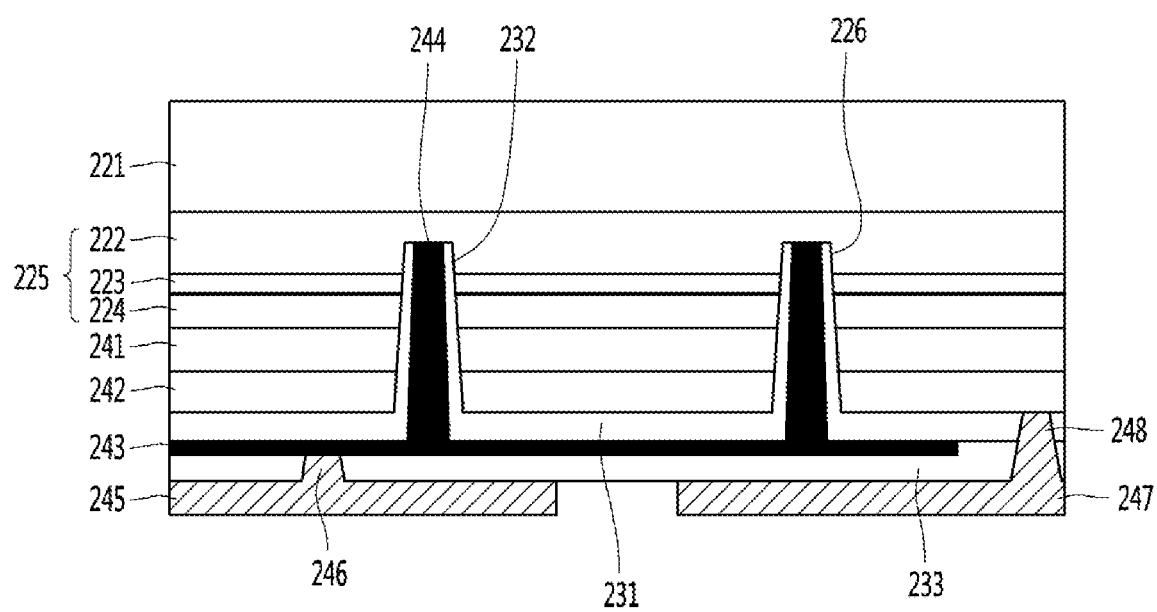
FIG. 12 is a view for describing another example of the light emitting diode according to the embodiment.

FIG. 12 is a view illustrating another example of a light emitting diode according to an embodiment.

Referring to FIG. 12, the light emitting diode includes a light emitting structure 225 and a plurality of electrodes 245 and 247. The light emitting structure 225 may be provided as the group II to VI compound semiconductor layer, the group III-V compound semiconductor layer, or the group II-VI compound semiconductor layer. The plurality of electrodes 245 and 247 may be selectively connected to the semiconductor layer of the light emitting structure 225 to supply power.

The light emitting diode may include a substrate 221. The substrate 221 may be disposed on the light emitting structure 225. The substrate 221 may be, for example, a light transmissive or insulation substrate or a conductive substrate. The substrate 221 may include, for example, at least one of sapphire ($Al_2O_3$), SiC, Si, GaAs, GaN, ZnO, Si, GaP, InP, Ge, and $Ga_2O_3$. A plurality of convex portions (not shown) may be disposed on at least one or all of top and bottom surfaces of the substrate 221 to improve light extraction efficiency. Each of the convex portions may include a hemispheric shape, a semi-elliptical surface, or a polygonal shape in a lateral cross-section. Here, the substrate 221 may be removed from the inside of the light emitting diode, but is not limited thereto.

The light emitting diode may include at least one of a buffer layer (not shown) and an lower conductive semiconductor layer (not shown) between the substrate 221 and the light emitting structure 225. The buffer layer may be a layer for reducing a lattice constant different between the substrate 221 and the semiconductor layer and may be made of a material selected from the group II-VI compound semiconductors. An undoped group III-V compound semiconductor layer may be further disposed under the buffer layer 112, but is not limited thereto. The substrate 221 may be removed.

The light emitting structure 225 may be disposed under the substrate 221 and includes a first conductive semiconductor layer 222, an active layer 223, and a second conductive semiconductor layer 224. Other semiconductor layers may be further disposed on at least one of the upper and lower layers 222, 223, and 224, but the present invention is not limited thereto.

The first conductive semiconductor layer 222 may be disposed below the substrate 221 and may include a semiconductor layer doped with a first conductive dopant, for example, an n-type semiconductor layer. The first conductive semiconductor layer 222 includes a composition formula of $In_xAl_yGa_{1-x-y}N$ ($0 \leq x \leq 1$, $0 \leq y \leq 1$, $0 \leq x+y \leq 1$). The first conductive semiconductor layer 222 may be a compound semiconductor of Group III-V elements such as GaN, AlN, AlGaN, InGaN, InN, InAlGaN, AlInN, AlGaAs, GaP, GaAs, GaAsP. The first conductive dopant is an n-type dopant and includes dopants such as Si, Ge, Sn, Se, and Te.

The active layer 223 is disposed under the first conductive semiconductor layer 222 and selectively includes a single quantum well, a multiple quantum well (MQW), a quantum wire structure, or a quantum dot structure. The active layer 223 includes a pair of a well layer and a barrier layer. The pair of the well layer and the barrier layer, for example, includes at least one pairs of InGaN/GaN, GaN/AlGaN, AlGaN/AlGaN, InGaN/AlGaN, InGaN/InGaN, AlGaAs/GaA, InGaAs/GaAs, InGaP/GaP, AlInGaP/InGaP, and InP/GaAs.

The second semiconductor layer 224 may be disposed under the active layer 223. The second semiconductor layer 224 includes a semiconductor with a second conductive type dopant, for example, a compositional formula of $In_xAl_yGa_{1-x-y}N$ ($0 \leq x \leq 1$, $0 \leq y \leq 1$, $0 \leq x+y \leq 1$). The second semiconductor layer 224 may be selected from the group consisting of GaN, AlN, AlGaN, InGaN, InN, InAlGaN, AlInN, AlGaAs, GaP, GaAs, GaAsP, and AlGaInP. The second semiconductor layer 13 is a p-type semiconductor layer with a p-type dopant such as Mg, Zn, Ca, Sr, or Ba.

The light emitting structure 225 is another example, the first conductive semiconductor layer 222 may be a p-type semiconductor layer, and the second conductive semiconductor layer 224 may be an n-type semiconductor layer. A third conductive type semiconductor layer having a polarity opposite to the second conductive type may be formed under the second conductive semiconductor layer 224. Also, the light emitting structure 225 may have any one of an n-p junction structure, a p-n junction structure, an n-p-n junction structure, and a p-n-p junction structure.

First and second electrodes 245 and 247 are disposed under the light emitting structure 225. The first electrode 245 is electrically connected to the first conductive semiconductor layer 222 and the second electrode 247 is electrically connected to the second conductive semiconductor layer 224. The first and second electrodes 245 and 247 may have a polygonal or circular bottom shape. The light emitting structure 225 may include a plurality of recesses 226.

The light emitting diode includes first and second electrode layers 241 and 242, a third electrode layer 243, and insulation layers 231 and 233. Each of the first and second electrode layers 241 and 242 may have a single or multi-layered structure and function as a current spreading layer. The first and second electrode layers 241 and 242 may include a first electrode layer 241 disposed under the light emitting structure 225 and a second electrode layer 242 disposed under the first electrode layer 241. The first electrode layer 241 may spread current, and the second electrode layer 241 may reflect incident light.

The first and second electrode layers 241 and 242 may be made of materials different from each other. The first electrode layer 241 may be made of a light transmissive material, for example, metal oxide or metal nitride. The first electrode layer 241 may be made of a material selected from indium tin oxide (ITO), ITO nitride (ITON), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO). The second electrode layer 242 may come into contact with a bottom surface of the first electrode layer 241 and function as a reflective electrode layer. The second electrode layer 242 may be made of a metal, for example, Ag, Au, or Al. When a portion of a region of the first electrode layer 241 is removed, the second electrode layer 242 may come into partial contact with the bottom surface of the light emitting structure 225.

For another example, the first and second electrode layers 241 and 242 may be laminated with an Omni-directional reflector layer (ODR) structure. The ODR structure may be a structure in which the first electrode layer 241 having a low refractive index and the second electrode layer 242 coming into contact with the first electrode layer 241 and made of a metal material having high reflectivity are laminated. The electrode layers 241 and 242 may have, for example, a laminated structure of ITO/Ag. A total orientation reflection angle may be improved at an interface between the first electrode layer 241 and the second electrode layer 242.

For another example, the second electrode layer 242 may be removed or provided as a reflective layer made of different material. The reflective layer may have a distributed bragg reflector (DBR) structure. The DBR structure may include a structure in which two dielectric layers having different refractive indexes are alternately disposed, for example, may include one of a SiO2 layer, a Si3N4 layer, a TiO2 layer, an Al2O3 layer, and an MgO layer. For another example, the electrode layers 241 and 242 may include all of the DBR structure and the ODR structure. In this case, the light emitting diode having light reflectivity of 98% or more may be provided. Since the light emitting diode mounted in the flip manner emits light reflected from the second electrode layer 242 through the substrate 221, most of light may be released in a vertical upward direction. Also, light emitted from a side surface of the light emitting diode may be reflected to a light exit region by the reflective member according to the embodiment.

The third electrode layer 243 may be disposed under the second electrode layer 242 and electrically insulated from the first and second electrode layers 241 and 242. The third electrode layer 243 may be made of a metal, for example, at least one of Ti, Cu, Ni, Au, Cr, Ta, Pt, Sn, Ag, and P. The first and second electrodes 245 and 247 are disposed under the third electrode layer 243.

The insulation layers 231 and 233 may prevent unnecessary contact between the layers of the first and second electrode layers 241 and 242, the third electrode layer 243, the first and second electrodes 245 and 247, and the light emitting structure 225 from occurring. The insulation layers 231 and 233 include first and second insulation layers 231 and 233. The first insulation layer 231 is disposed between the third electrode layer 243 and the second electrode layer 242. The second insulation layer 233 is disposed between the third electrode layer 243 and the first and second electrodes 245 and 247.

The third conductive layer 243 is connected to the first conductive type semiconductor layer 222. The connection part 244 of the third electrode layer 243 protrudes from a via structure through the first and second electrode layers 241 and 242 and the light emitting structure 225 to come into contact with the first conductive type semiconductor layer 222. The connection part 244 may be provided in plurality. A portion 232 of the first insulation layer 231 extends to the surrounding of the connection part 224 of the third electrode layer 243 along to the recess 226 of the light emitting structure 225 to prevent the third insulation layer 243, the first and second electrode layers 241 and 242, the second conductive type semiconductor layer 224, and the active layer 223 from being electrically connected to each other. An insulation layer may be disposed on a side surface of the light emitting structure 225 to protect the side surface, but is not limited thereto.

The second electrode 247 is disposed under the second insulation layer 233 and comes into contact with or is connected to at least one of the first and second electrode layers 241 and 242 through an opened region of the second insulation layer 233. The first electrode 245 is disposed under the second insulation layer 233 and connected to the third electrode layer 243 through the opened region of the second insulation layer 233. Thus, a protrusion 248 of the second electrode 247 is electrically connected to the second conductive type semiconductor layer 224 through the first and second electrode layers 241 and 242, and a protrusion 246 of the first electrode 245 is electrically connected to the first conductive type semiconductor layer 222 through the third electrode layer 243.

In an embodiment, a phosphor layer (not shown) may be disposed on the light emitting diode, and the phosphor layer may be disposed on the upper surface or the upper surface of the light emitting diode. The wavelength conversion efficiency of the light emitted from the light emitting diode can be improved in the phosphor layer. The phosphor layer may include at least one of a red phosphor, a green phosphor, a blue phosphor, and a yellow phosphor, but is not limited thereto. The phosphor may be selectively formed from YAG, TAG, Silicate, Nitride or Oxy-nitride based materials, for example.

Light Emitting Module

Figure 13:
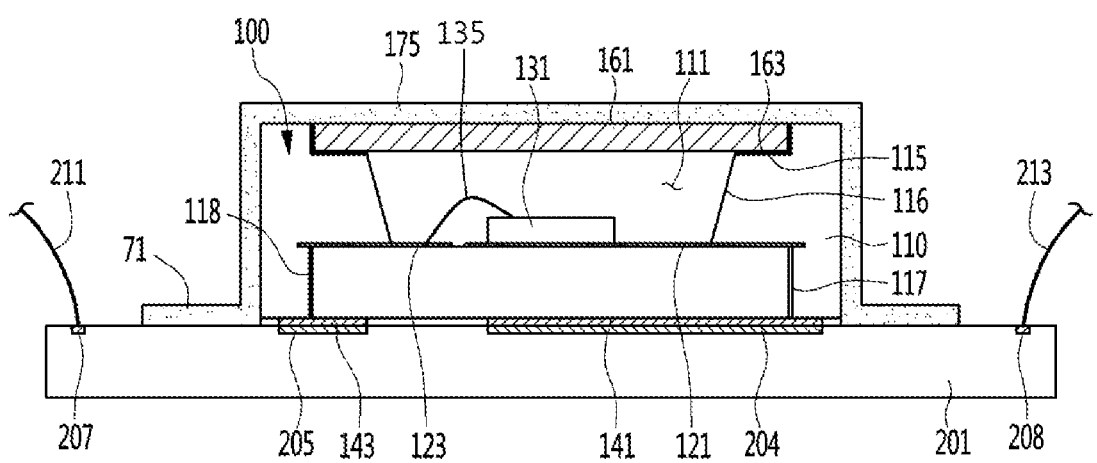
FIG. 13 is a view showing an example of a light emitting module having a light emitting device according to an embodiment.
Figure 14:
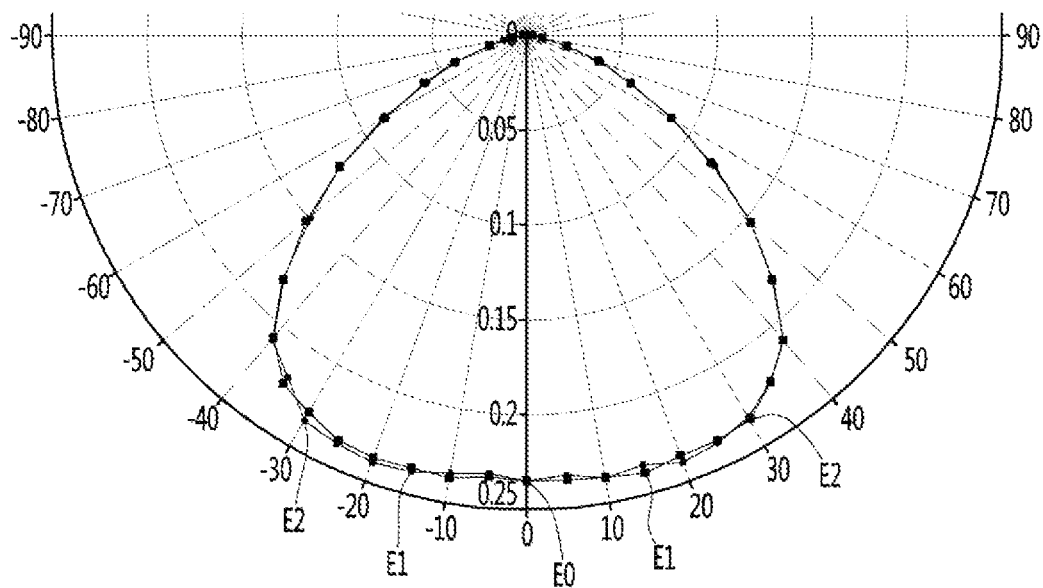
FIG. 14 is a view showing a first example of a luminous intensity of a light emitting device according to an embodiment.

FIG. 13 is a view showing an example of a light emitting module having FIG. 1 or FIG. 8.

Referring to FIG. 13, a light emitting module 200 according to the embodiment includes a light emitting device 100, a circuit board 201 on which the light emitting device 100 is disposed, and a moisture-proof film 175 covering the light emitting device 100 and the circuit board 201.

The light emitting device 100 may include a body 110 having a recess 111, a plurality of electrodes 121 and 123 disposed in the recess 111, and a light emitting diode disposed on at least one of the plurality of electrodes 121 and 123, and an optical film 161 disposed on the recess 111.

The light emitting diode 131 may emit ultraviolet light, that is, ultraviolet light having a wavelength in the range of 100 nm to 400 nm, but the invention is not limited thereto. The light emitting diodes 131 may be arranged in a flip chip manner or by die bonding. The optical film 161 may be formed of a glass material having no damage such as bonding breakage due to the ultraviolet wavelength. The construction of such a light emitting device 100 will be described with reference to the description of the embodiments disclosed above.

The circuit board 201 includes a plurality of bonding pads 204 and 205. The plurality of bonding pads 204 and 205 may be electrically connected to the first and second pads 141 and 143 disposed on the lower surface of the body 110.

The circuit board 201 may be connected to signal cables 211 and 213 via external connection terminals 207 and 208 and the signal cables 211 and 213 may be supplied with power from an outside.

The moisture-proof film 175 is disposed on the upper surface and the side surface of the light emitting device 100 and the upper surface of the circuit board 201. The moisture-proof film 175 is disposed on the upper surface of the optical film 161 of the light emitting device 100, the upper surface and the side surface of the body 110. An extended portion 71 of the moisture-proof film 175 extends from the side of the body 110 to the upper surface of the circuit board 201.

The moisture-proof film 175 may be a fluororesin material, and may transmit the light without being broken by the light emitted from the light emitting diode 131. The moisture-proof film 175 may be used in at least one of PCTFE (Polychlorotrifluoroethylene), ETFE (Ethylene+Tetrafluoroethylene), FEP (Fluorinated ethylene propylene copolymer), and PFA (Perfluoroalkoxy). Here, a transmittance at ultraviolet wavelength becomes higher in the order of PCTFE, ETFE, FEP and PFA, and a moisture absorption rate at ultraviolet wavelength becomes higher in the order of PCTFE, FEP and PFA. The embodiment can be used as a moisture-proof layer using at least one of PCTFE, FEP and PFA.

The moisture-proof film 175 may block moisture or moisture penetrating through the circuit board 201 as well as water or moisture penetrating through the side and top surfaces of the light emitting device 100. The thickness of the moisture-impermeable film 175 may be in the range of 0.5 µm to 10 µm. When the thickness of the moisture-proof layer 175 is more than the above range, the light transmittance is markedly decreased.

As another example, the moisture-proof material may be disposed in a region between the lower surface of the light emitting device 100 and the circuit board 201. Here, the moisture-proof material may be formed on the surface of the bonding pads 204 and 205 of the circuit board 201. The moisture-proof material may block moisture or moisture penetration in a region between the lower surface of the light emitting device 100 and the circuit board 201.

The moisture-proof film 175 may be spaced apart from the bonding areas of the external connection terminals 207 and 208 and the signal cables 211 and 213. As another example, the moisture-proof film 175 may cover the external connection terminals 207 and 208. In this case, the moisture-proof film 175 can prevent moisture or moisture from penetrating through the external connection terminals 207 and 208.

As another example, a moisture-proof layer (not shown) may be disposed on the upper surface of the light emitting diode 131 and the bottom of the recess 111 to protect the light emitting diode 131 from moisture or moisture.

Such a moisture-proof material may contain fluorine. The fluorine has a strong chemical bonding force with carbon and does not cause molecular bond breakage due to ultraviolet. Such a moisture-proof material can be defined as a fluororesin-based layer, and its molecular chain is a helical structure. The molecular chain structure has a three-dimensional spiral structure, so that fluorine atoms seal around a carbon-carbon bond. The dampproof layer protects the destruction of molecular chains due to penetration of ultraviolet or oxygen. Also, the dampproof layer may protect the device by blocking oxygen or moisture such as water or oil from penetrating to the surface of the device as much as possible.

The light emitting device according to the embodiment and the light source unit having the same can be used as a device for sterilizing the indoor unit, the evaporator, and the condensed water of the refrigerator, and the sterilizing device in the device such as the air washer, And a sterilizing device for discharging water, and a sterilizing device in a toilet. Such a sterilization apparatus may optionally include the moisture-proofing film disclosed above. Or the light emitting device according to the embodiment can be applied to a UV lamp of an exposure machine or a curing machine.

Features, structures, and effects described in the above embodiments are incorporated into at least one embodiment, but are not limited to only one embodiment. Moreover, features, structures, and effects exemplified in one embodiment can easily be combined and modified for another embodiment by those skilled in the art. Therefore, these combinations and modifications should be construed as falling within the scope of the present invention.

INDUSTRIAL APPLICABILITY

In the light emitting device of the present invention, a central luminous intensity of ultraviolet rays may be improved and thus the light emitting device may be used as a light source unit of a sterilizing apparatus.

In the light emitting device of the present invention, the central luminous intensity of ultraviolet rays may be improved and thus the light emitting device may be used as an UV lamp of an exposure apparatus or a curing apparatus.

The present invention may be applied to various ultraviolet light emitting diode (LED) lamps.

The invention claimed is:
1. A light emitting device comprising:
a body including a recess having an open upper portion;
a plurality of electrodes disposed in the recess;
a light emitting diode disposed in the recess and electrically connected to the plurality of electrodes;
an optical film disposed on the recess,
wherein the recess has inclined side surfaces and a bottom,
wherein the light emitting diode is disposed on a central portion of the bottom of the recess,
wherein the plurality of electrodes are disposed on the bottom of the recess,
wherein the light emitting diode is disposed on at least one of the plurality of electrodes, wherein an upper periphery of the body has a stepped structure in which an outer periphery of the optical film is disposed,
wherein the optical film is formed of a glass material,
wherein a space between the optical film and the light emitting diode is an empty space,
wherein the side surfaces of the recess are inclined at a first angle with respect to an optical axis of the light emitting diode, and
wherein a value obtained by multiplying a value of a minimum distance between the light emitting diode and a lower end of the side surface of the recess by a tangent value for the first angle ranges from 0.21 to 0.42,
wherein each of the inclined side surfaces of the recess faces each of side surfaces of the light emitting diode, respectively,
wherein the body includes a ceramic material,
wherein the light emitting diode emits light having a wavelength of 100 nm to 280 nm,
wherein a thickness of the light emitting diode ranges of 0.12 mm±0.03 mm,
wherein a depth of the recess is a depth excluding a depth of the stepped structure and is 1.2 mm±0.2 mm,
wherein the depth of the recess is a straight-line distance between an upper surface of the plurality of electrodes disposed at the bottom of the recess and a bottom of the stepped structure,
wherein the each of the side surfaces of the recess includes a first region having a specular reflective surface at an upper periphery of the recess and a second region having a scattered reflective surface adjacent to the bottom of the recess at a lower periphery of the recess, the first and second regions being inclined at a same angle as the first angle,
wherein a lower end of the first region is disposed at a position equal to or higher than a height of an upper surface of the light emitting diode,
wherein the second region is disposed to face side surfaces of the light emitting diode,
wherein a thickness of the first region is greater than a thickness of the second region,
wherein an area of the first region is greater than an area of the second region,
wherein an Ag metal is disposed at the first region, and
wherein a diffusing agent is disposed at the second region.

2. The light emitting device of claim 1, wherein:
a minimum distance between the light emitting diode and the side surface of the recess ranges from 0.3 mm to 1 mm; and
the first angle ranges from 20 degrees to 40 degrees.

3. The light emitting device of claim 1, wherein:
a central luminous intensity of light emitted from the light emitting diode is higher than a luminous intensity of ±15 degrees or ±30 degrees around the central luminous intensity; and
a ratio of the central luminous intensity of the light which is emitted from the light emitting diode through the optical film to a luminous intensity of ±15 degrees or ±30 degrees around the central luminous intensity is 1 or more.

4. The light emitting device of claim 1, comprising:
an adhesive material configured to adhere the outer periphery of the optical film to the stepped structure, and
wherein a width of the optical film is smaller than a width of an upper portion of the body and greater than an upper width of the recess.

5. The light emitting device of claim 1, wherein an absolute value of a difference between a first exit angle of light which is reflected by the lower end point of the first region among rays of light emitted from the light emitting diode and a second exit angle of light which is reflected by an upper end point of the first region ranges from 17 degrees to 24 degrees.

6. The light emitting device of claim 5, wherein:
any one of the first exit angle and the second exit angle is 20 degrees or more; and
the first and second regions of the side surfaces of the recess have inclined angles in a range from 45 degrees to 68 degrees with respect to an axis perpendicular to the bottom of the recess.

7. The light emitting device of claim 5, wherein:
a ratio of the depth of the recess to the thickness of the first region ranges from 1:0.7 to 1:0.8; and
a ratio of the thickness of the first region to the thickness of the second region at the side surface of the recess ranges from 2.5:1 to 3.5:1.

8. The light emitting device of claim 5, wherein:
a thickness of the optical film is in a range of 0.1 mm to 0.5 mm.

9. The light emitting device of claim 1, comprising:
a plurality of pads on a lower surface of the body; and
a plurality of via electrodes in the body,
wherein each of the plurality of pads and each of the plurality of via electrodes are electrically connected to the light emitting diode.

10. The light emitting device of claim 9, wherein:
a thickness of the body ranges from 1 mm to 2 mm, and
wherein the depth of the recess is larger than a sum of thicknesses of the light emitting diode and the optical film.

11. The light emitting device of claim 1, wherein:
the each of the side surfaces of the light emitting diode is disposed at a same interval as at least two of the side surfaces of the recess.

12. The light emitting device of claim 11, wherein:
the each of the side surfaces of the light emitting diode is equally spaced from each of the side surfaces of the recess, and
wherein a minimum distance between the light emitting diode and each of the side surfaces of the recess ranges from 0.3 mm to 1 mm.

13. The light emitting device of claim 1, wherein:
the first angle in the side surface of the recess is in a range of 40 degrees to 70 degrees.

14. The light emitting device of claim 1, wherein:
a distance between a center of the light emitting diode and the lower end of the side surface of the recess is 2.1 mm or less.

* * * * *